United States Patent
Köhler, deceased et al.

(10) Patent No.: US 6,803,392 B1
(45) Date of Patent: Oct. 12, 2004

(54) PHOTOINITIATOR FORMULATIONS

(75) Inventors: Manfred Köhler, deceased, late of Freiburg (DE), by Vivian Köhler, Antoin Kamran Köhler, executors; by Inga Köhler, legal representative, Berlin (DE); Beat Michael Aebli, Basel (CH); Martin Holer, Wallbach (CH); Ernst Eckstein, Rheinfelden (DE); Jean-Pierre Wolf, Maisprach (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 111 days.

(21) Appl. No.: 10/088,222

(22) PCT Filed: Oct. 12, 2000

(86) PCT No.: PCT/EP00/10043

§ 371 (c)(1),
(2), (4) Date: Mar. 18, 2002

(87) PCT Pub. No.: WO01/29093

PCT Pub. Date: Apr. 26, 2001

(30) Foreign Application Priority Data

Oct. 20, 1999 (EP) ............................................. 99810953

(51) Int. Cl.⁷ .............................. C08F 2/46; B01J 31/00
(52) U.S. Cl. ............................. 522/64; 522/84; 522/38; 522/86; 522/87; 522/88; 522/101; 522/102; 522/104; 522/108; 522/150; 522/153; 522/178; 522/182; 502/5; 502/164; 502/162; 502/155; 502/152
(58) Field of Search ............................... 522/64, 6, 84, 522/38, 86, 87, 88, 101, 102, 104, 108, 150, 153, 178, 182; 502/5, 164, 162, 155, 152

(56) References Cited

U.S. PATENT DOCUMENTS

| 4,533,652 A | * | 8/1985 | Tanaka et al. ............... 502/167 |
| 4,861,916 A | * | 8/1989 | Kohler et al. ................ 568/337 |
| 4,965,294 A | | 10/1990 | Ohngemach et al. .......... 522/79 |
| 5,080,994 A | * | 1/1992 | Breton et al. ........... 430/137.17 |
| 5,116,534 A | | 5/1992 | Mollet et al. ................ 252/308 |
| 5,153,284 A | * | 10/1992 | Amano et al. ............... 526/200 |
| 5,168,087 A | | 12/1992 | Li Bassi et al. ............. 502/164 |
| 5,196,142 A | | 3/1993 | Mollet et al. ................ 252/311 |
| 5,549,847 A | | 8/1996 | Goliro et al. ................ 252/394 |
| 5,942,290 A | | 8/1999 | Leppard et al. ............. 427/510 |
| 6,361,925 B1 | | 3/2002 | Leppard et al. .......... 430/281.1 |
| 6,399,805 B2 | | 6/2002 | Wolf et al. .................. 556/405 |

FOREIGN PATENT DOCUMENTS

| EP | 0085305 | * | 8/1983 |
| EP | 0341534 | * | 11/1989 |
| EP | 0386650 | | 9/1990 |
| WO | 82/02894 | | 9/1982 |
| WO | WO 8605778 | * | 4/1986 |
| WO | 99/07796 | | 2/1999 |

OTHER PUBLICATIONS

Photoinitiators for UV curing: A formulator's Guide. From Ciba pp. 1–42. (year not given).*

* cited by examiner

Primary Examiner—James J. Seidleck
Assistant Examiner—Sanza L. McClendon
(74) Attorney, Agent, or Firm—Tyler A. Stevenson

(57) ABSTRACT

Aqueous storage-stable, non-sedimenting photoinitiator suspensions comprising (a) a mono- or bis-acylphosphine oxide of formula (I), wherein $R_1$ is $C_1$–$C_{20}$alkyl; $C_2$–$C_{20}$alkyl interrupted by one or more O atoms; $C_1$–$C_{12}$alkoxy; phenyl-$C_1$–$C_4$alkyl; or phenyl that is unsubstituted or substituted by $C_1C_{20}$alkyl, $C_1$–$C_{12}$alkoxy, halogen, cyclopentyl, cyclohexyl, $C_2$–$C_{12}$alkenyl, $C_2$–$C_{18}$alkyl interrupted by one or more O atoms, and/or by phenyl-$C_1$–$C_4$alkyl; or $R_1$ is biphenylyl; $R_2$ is an aromatic radical or has one of the meanings give for $R_1$; $R_3$ and $R_4$ are each independently of the other $C_1$–$C_{12}$alkyl, $C_1$–$C_{12}$alkoxy or halogen; and $R_5$ is hydrogen, $C_1$–$C_{12}$alkyl, $C_1$–$C_{12}$alkoxy or halogen; (b) a dispersant; and (c) water are suitable especially in the photopolymerisation of aqueous formulations comprising ethylenically unsaturated monomers.

16 Claims, No Drawings

PHOTOINITIATOR FORMULATIONS

The present application relates to aqueous suspensions of photoinitiators and to the preparation and use thereof.

It is known in the art to add additives in dispersed form, that is to say in the form of emulsions or suspensions, to polymerisable formulations, especially in order to facilitate incorporation of the additives into those formulations. The additives are for that purpose usually homogeneously dissolved in one phase or melted with one another and then dispersed in water. For example, in U.S. Pat. No. 5,196,142 and U.S. Pat. No. 5,116,534 aqueous emulsions of antioxidants are described and in U.S. Pat. No. 5,549,847 aqueous dispersions of corrosion inhibitors are disclosed. Published in U.S. Pat. No. 4,965,294 and U.S. Pat. No. 5,168,087 are aqueous emulsions of photoinitiators, especially hydroxyketones.

There is a need in the art for effective, stable photoinitiators that can readily be incorporated.

The invention relates to aqueous, storage-stable, non-sedimenting suspensions comprising (a) at least one mono- or bis-acylphosphine oxide of formula I

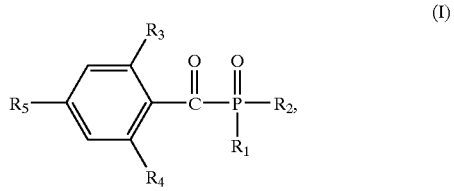

wherein
$R_1$ is $C_1-C_{20}$alkyl; $C_2-C_{20}$alkyl interrupted by one or more O atoms; $C_1-C_{12}$alkoxy; phenyl-$C_1-C_4$alkyl; or phenyl that is unsubstituted or substituted by $C_1-C_{20}$alkyl, $C_1-C_{12}$alkoxy, halogen, cyclopentyl, cyclohexyl, $C_2-C_{12}$alkenyl, $C_2-C_{18}$alkyl interrupted by one or more O atoms, and/or by phenyl-$C_1-C_4$alkyl; or $R_1$ is biphenylyl;
$R_2$ is the radical

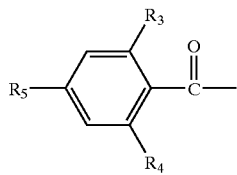

or has one of the meanings given for $R_1$;
$R_3$ and $R_4$ are each independently of the other $C_1-C_{12}$alkyl, $C_1-C_{12}$alkoxy or halogen; and
$R_5$ is hydrogen, $C_1-C_{12}$alkyl, $C_1-C_{12}$alkoxy or halogen;

(b) at least one dispersant;
(c) water; and, optionally,
(d) further additives.

$C_1-C_{20}$Alkyl is linear or branched and is, for example, $C_1-C_{12}$-, $C_1-C_8$-, $C_1-C_6$- or $C_1-C_4$-alkyl. Examples are methyl, ethyl, propyl, isopropyl, n-butyl, sec-butyl, isobutyl, ten-butyl, pentyl, hexyl, heptyl, 2,4,4-trimethylpentyl, 2-ethylhexyl, octyl, nonyl, decyl, undecyl, dodecyl, tetradecyl, pentadecyl, hexadecyl, heptadecyl, octadecyl, nonadecyl and eicosyl. For example, $R_1$ is $C_1-C_{12}$alkyl, especially $C_1-C_8$alkyl, preferably branched octyl, for example 2,4,4-trimethylpentyl.

$R_3$, $R_4$ and $R_5$ are, for example, $C_1-C_8$alkyl, especially $C_1-C_4$alkyl. Butyl and, especially, methyl are preferred.

$C_1-C_{12}$Alkyl, $C_1-C_8$alkyl and $C_1-C_4$alkyl are likewise linear or branched and have, for example, the meanings given above up to the corresponding number of carbon atoms.

$C_2-C_{20}$Alkyl interrupted one or more times by —O— is interrupted, for example, from 1 to 9 times, e.g. from 1 to 7 times or once or twice, by —O—. If the radicals are interrupted by more than one —O—, then the O atoms are each separated from the other(s) by at least one methylene group, yielding, for example, structural units such as —CH$_2$—O—CH$_3$, —CH$_2$CH$_2$—O—CH$_2$CH$_3$, —[CH$_2$CH$_2$O]$_y$—CH$_3$, wherein y=1–9, —(CH$_2$CH$_2$O)$_7$CH$_2$CH$_3$, —CH$_2$—CH(CH$_3$)—O—CH$_2$—CH$_2$CH$_3$ or —CH$_2$—CH(CH$_3$)—O—CH$_2$—CH$_3$.

$C_2-C_{18}$Alkyl interrupted by one or more O atoms is as defined above up to the corresponding number of carbon atoms.

$C_1-C_{12}$Alkoxy is a linear or branched radical and is, for example, $C_1-C_8$-, $C_1-C_6$- or $C_1-C_4$-alkoxy. Examples are methoxy, ethoxy, propoxy, isopropoxy, n-butyloxy, sec-butyloxy, isobutyloxy, tert-butyloxy, pentyloxy, hexyloxy, heptyloxy, 2,4,4-trimethylpentyloxy, 2-ethyl-hexyloxy, octyloxy, nonyloxy, decyloxy and dodecyloxy, especially methoxy, ethoxy, propoxy, isopropoxy, n-butyloxy, sec-butyloxy, isobutyloxy and tert-butyloxy, preferably methoxy. $C_1-C_8$Alkoxy, $C_1-C_6$alkoxy and $C_1-C_4$alkoxy are likewise linear or branched and have, for example, the meanings given above up to the corresponding number of carbon atoms. $R_1$ is, for example, $C_1-C_4$alkoxy, especially methoxy or ethoxy, preferably ethoxy. $R_3$, $R_4$ and $R_5$ are, for example, $C_1-C_4$alkoxy, especially methoxy.

Phenyl-$C_1-C_4$alkyl is phenyl-substituted $C_1-C_4$alkyl and is, for example, benzyl, phenylethyl, α-methylbenzyl, phenylpropyl or α,α-dimethylbenzyl, especially benzyl. Phenyl-$C_1-C_2$alkyl is preferred.

Halogen is fluorine, chlorine, bromine or iodine, especially chlorine or bromine, preferably chlorine.

$C_2-C_{12}$Alkenyl radicals may be mono- or poly-unsaturated and linear or branched and are, for example, $C_2-C_8$-, $C_2-C_6$- or $C_2-C_4$-alkenyl. Examples are allyl, methallyl, 1,1-dimethylallyl, 1-butenyl, 2-butenyl, 1,3-pentadienyl, 1-hexenyl, 1-octenyl, decenyl and dodecenyl, especially allyl. $R_1$ as $C_2-C_{12}$alkenyl is, for example, $C_2-C_8$-, $C_2-C_6$- or, especially, $C_2-C_4$-alkenyl.

$R_1$ as substituted phenyl is mono- to penta-substituted, for example mono-, di- or tri-substituted, especially mono- or di-substituted, on the phenyl ring. Preferred substituents for $R_1$ as substituted phenyl are $C_1-C_4$alkyl, especially methyl, and $C_1-C_6$alkoxy, especially pentyloxy and methoxy.

When R is the radical

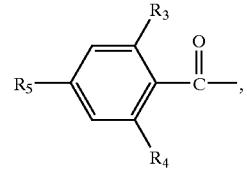

the meanings of $R_3$, $R_4$ and $R_5$ in that radical do not necessarily have to be identical to those of the radicals $R_3$, $R_4$ and $R_5$ in the other benzoyl group in the compound of formula I, that is to say, suitable compounds of formula I also include asymmetrical bisacylphosphine oxides.

The expression "and/or" in relation to the definition of the present invention indicates that not only one of the defined alternatives (substituents) but several different defined alternatives (substituents) may be present together, that is to say, mixtures of different alternatives (substituents) may be present.

The expression "at least one" defines "one" or "more than one", for example one, two or three, preferably one or two.

The preparation of the compounds of formula I is known to the person skilled in the art and is widely described in the literature. For example, corresponding processes are described in the following specifications: U.S. Pat. No. 4,737,593, U.S. Pat. No. 4,792,632, U.S. Pat. No. 5,218,009, U.S. Pat. No. 4,298,738, U.S. Pat. No. 5,504,236, U.S. Pat. No. 5,399,770, U.S. Pat. No. 5,767,169.

For example, compounds of formula I having two benzoyl groups (bisacylphosphine oxides) can be prepared, for example, by double acylation of a primary phosphine using at least two equivalents of an acid chloride in the presence of at least two equivalents of a base, and subsequent oxidation of the resulting diacylphosphine. The reaction conditions can be obtained from the above-mentioned literature sources.

The monoacylphosphine oxides can be obtained in an analogous manner.

Some of the compounds of formula I are also obtainable commercially, such as, for example, 2,4,6-trimethylbenzoyldiphenylphosphine oxide ($^{RTM}$Lucirin TPO, BASF); bis(2,4,6-trimethyl-benzoyl)phenylphosphine oxide ($^{RTM}$Irgacure 819, Ciba Spezialitätenchemie) and bis (2,6-di-methoxybenzoyl)-2,4,4-trimethylpentylphosphine oxide (as $^{RTM}$Irgacure 1700, $^{RTM}$Irgacure 1800 and $^{RTM}$Irgacure 1850 in admixture with a-hydroxyketones from Ciba Spezialitätenchemie).

In the suspensions according to the invention, preference is given to the compounds of formula I wherein $R_1$ is $C_1$–$C_{20}$alkyl; $C_1$–$C_4$alkoxy; or phenyl that is unsubstituted or substituted by $C_1$–$C_{12}$alkyl, $C_1$–$C_{12}$alkoxy and/or by halogen;

$R_2$ is the radical

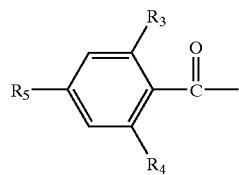

or has one of the meanings given for $R_1$;

$R_3$ and $R_4$ are each independently of the other $C_1$–$C_4$alkyl or $C_1$–$C_4$alkoxy; and $R_5$ is hydrogen, $C_1$–$C_{12}$alkyl or $C_1$–$C_{12}$alkoxy.

Preference is given also to an aqueous suspension comprising as component (a) a compound of formula I wherein $R_1$ is $C_1$–$C_{20}$alkyl; $C_2$–$C_{20}$alkyl interrupted by one or more O atoms; benzyl; or phenyl that is unsubstituted or substituted by $C_1$–$C_{20}$alkyl, $C_1$–$C_{12}$alkoxy and/or by halogen;

$R_2$ is the radical

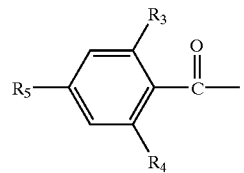

or has one of the meanings given for $R_1$;

$R_3$ and $R_4$ are each independently of the other $C_1$–$C_4$alkyl, $C_1$–$C_4$alkoxy or halogen; and $R_5$ is hydrogen, $C_1$–$C_{12}$alkyl, $C_1$–$C_{12}$alkoxy or halogen.

Of special interest as photoinitiators in the suspensions according to the invention are compounds of formula I wherein $R_2$ is the radical

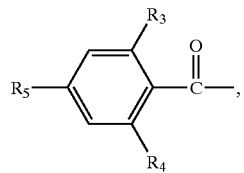

that is to say, bisacylphosphine oxides.

Special mention is made of compounds of formula I wherein $R_1$ is phenyl or $C_1$–$C_8$alkyl.

Special preference is given to compounds of formula I wherein $R_3$ and $R_4$ are $C_1$–$C_{12}$alkyl, especially $C_1$–$C_4$alkyl or $C_1$–$C_{12}$alkoxy, especially $C_1$-$C_4$alkoxy.

$R_5$ in the compounds of formula I is especially $C_1$–$C_4$alkyl or hydrogen.

Compounds of formula I of interest are those wherein $R_3$, $R_4$ and $R_5$ are $C_1$–$C_4$alkyl, especially methyl. Also of interest are compounds of formula I wherein $R_3$ and $R_4$ are $C_1$–$C_4$alkoxy, especially methoxy, and $R_5$ is hydrogen.

Preferred compounds of formula I used as photoinitiators in the suspensions according to the invention are bis(2,6-dimethoxybenzoyl)2,4,4-trimethylpentylphosphine oxide;

bis(2,4,6-trimethylbenzoyl)-2,4-dipentyloxyphenylphosphine oxide;

bis(2,4,6-trimethylbenzoyl)phenylphosphine oxide; and 2,4,6-trimethylbenzoyldiphenylphosphine oxide.

Photoinitiators in solid physical form, especially, are used in the suspensions according to the invention.

It will be understood that the suspensions according to the invention may also comprise a plurality of compounds of formula I. For example, suspensions comprising a monoacylphosphine oxide in combination with a bisacylphosphine oxide or comprising a plurality of bisacylphosphine oxides are of interest, for example mixtures of 2,4,6-trimethylbenzoyldiphenylphosphine oxide and bis(2,4,6-trimethylbenzoyl)phenylphosphine oxide or 2,4,6-trimethylbenzoyldiphenylphosphine oxide and bis(2,6dimethoxybenzoyl)-2,4,4-trimethyl-pentylphosphine oxide or bis(2,4,6-trimethylbenzoyl)phenylphosphine oxide and bis(2,6-dimethoxybenzoyl)-2,4,4-trimethylpentylphosphine oxide.

Preferred suspensions according to the invention are those wherein (a) is a compound of formula I wherein $R_1$ is phenyl or $C_1$–$C_{12}$alkyl; $R_2$ is

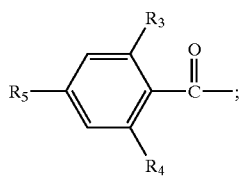

$R_3$ and $R_4$ are $C_1$–$C_4$alkyl or $C_1$–$C_4$alkoxy; and $R_5$ is hydrogen or $C_1$–$C_4$alkyl; and (b) is an alkali salt of a carboxylic acid polymer, or is polyvinyl alcohol or a modified polyacrylate.

Suitable dispersants (b) are all surface-active compounds, preferably anionic and non-ionic surfactants and polymeric dispersants. The following classes of compounds are examples of the dispersants that can be used according to the invention:

1. Anionic Surfactants 1.1 Condensates of aromatic sulfonic acids with formaldehyde, such as condensation products of formaldehyde and naphthalenesulfonic acid or of formaldehyde, naphthalenesulfonic acid and benzenesulfonic acid, or condensation products of crude cresol, formaldehyde and naphthalenesulfonic acid.

1.2 Lignosulfonates, for example those obtained by the sulfite or kraft process. Preferably these are products some of which are hydrolysed, oxidised or desulfonated and fractionated by known processes, for example according to molecular weight or the degree of sulfonation. Mixtures of sulfite- and kraft-lignosulfonates are very effective.

1.3 Dialkyl sulfosuccinates in which the alkyl moieties are branched or unbranched, for example dipropyl sulfosuccinate, diisobutyl sulfosuccinate, diamyl sulfosuccinate, bis(2-ethyl hexyl)sultosuccinate or dioctyl sullosuccinate.

1.4 Sulfated or sulfonated fatty acids or fatty acid esters of fatty acids, for example sulfated oleic acid, elaidic acid or ricinolic acid and the lower alkyl esters thereof, for example the ethyl, propyl or butyl esters. Also very suitable are the corresponding sulfated oils, such as olive oil, rapeseed oil and, especially, castor oil.

1.5 Reaction products of ethylene oxide and/or propylene oxide with saturated or unsaturated fatty acids, fatty alcohols, fatty amines, alicyclic alcohols or aliphatic-aromatic hydrocarbons that are terminally esterified with an inorganic oxygen-containing acid or a polybasic carboxylic acid. Such compounds are preferably compounds of formula

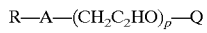
    R—A—$(CH_2C_2HO)_p$—Q wherein R is an aliphatic hydrocarbon radical having from 8 to 22 carbon atoms or a cycloaliphatic or aliphatic-aromatic hydrocarbon radical having from 10 to 22 carbon atoms; A is —O—, —NH— or —CO—O—; Q is the acid radical of an Inorganic, polybasic acid or the radical of a polybasic carboxylic acid and p is a number from 1 to 20, preferably from 1 to 5. The radical R—A— is derived, for example, from a higher alcohol, such as decyl alcohol, lauryl alcohol, tridecyl alcohol, myristyl alcohol, cetyl alcohol, stearyl alcohol, oleyl alcohol, arachidyl alcohol, hydroabietyl alcohol or behenyl alcohol; from a fatty amine, such as stearylamine, palmitylamine or oleylamine: from a fatty acid, such as caprylic acid, capric acid, lauric acid, myristic acid, palmitc acid, stearic acid, arachidic acid, behenic acid, coconut fatty ($C_8$–$C_{18}$)acid, deconoic acid, dodecenoic acid, tetradecenoic acid, hexadecenoic acid, oleic acid, linoleic acid, linolenic acid, elcosenoic acid, docosenoic acid or clupanodonic acid; or from an alkylphenol, such as butylphenol, hexylphenol, noctylphenol, n-nonylphenol, p-tert-octylphenol, p-tertnonylphenol, decylphenol, dodecylphenol, tetradecylphenol or hexadecyiphenol.

The acid radical Q is normally derived from a low-molecular-weight dicarboxylic acid, such as maleic acid, malonic acid, succinic acid or sulfosuccinic acid, and is linked by way of an ester bridge to the radical R—A—$(CH_2CH_2O)_p$—. Preferably, however, Q is derived from an inorganic polybasic acid, such as orthophosphoric acid or sulfuric acid. The acid radical Q is preferably in salt form, for example in the form of an alkali metal salt, ammonium salt or amine salt. Examples of such salts are sodium, potassium, ammonium, trimethylamine, ethanolamine, diethanolamine and triethanolamine salts.

The anionic dispersants are normally in the form of their alkali metal salts, their ammonium salts or their water-soluble amine salts. Dispersants with a low electrolyte content will preferably be used.

2. Non-ionic Surfactants ethylene oxide adducts from the class of the addition products of ethylene oxide with higher fatty acids, saturated or unsaturated fatty alcohols, fatty amines, mercaptans, fatty acid amides, fatty acid alkylolamides or fatty amines, or with alkylphenols or alkylthiophenols, which adducts preferably contain from 5 to 100 mol of ethylene oxide per mol of the mentioned compounds, as well as ethylene oxide-propylene oxide block polymers and ethylenediamine-ethylene oxide-propylene oxide adducts. Such non-ionic surfactants include:

2.1 reaction products of saturated and/or unsaturated fatty alcohols having from 8 to 20 carbon atoms containing from 20 to 100 mol of ethylene oxide per mol of alcohol, preferably saturated linear $C_{16}$–$C_{18}$alcohols containing from 25 to 80 mol, preferably 25 mol, of ethylene oxide per mol of alcohol;

2.2 reaction products of saturated and/or unsaturated fatty acids having from 8 to 20 carbon atoms containing from 5 to 20 mol of ethylene oxide per mol of acid;

2.3 reaction products of alkylphenols having from 7 to 12 carbon atoms containing from 5 to 25 mol of ethylene oxide per mol of phenolic hydroxy group, preferably reaction products of mono- or di-alkylphenols containing from 10 to 20 mol of ethylene oxide per mol of phenolic hydroxy group;

2.4 reaction products of saturated and/or unsaturated fatty acid amides having up to 20 carbon atoms containing from 5 to 20 mol of ethylene oxide per mol of acid amide, preferably oleyl amides containing from 8 to 15 mol of ethylene oxide per mol of acid amide;

2.5 reaction products of saturated and/or unsaturated fatty acid amines having from 8 to 20 carbon atoms containing from 5 to 20 mol of ethylene oxide per mol of amine, preferably oleylamines containing from 8 to 15 mol of ethylene oxide per mol of amine;

2.6 ethylene oxide-propylene oxide block polymers containing from 10 to 80% ethylene oxide and having molecular weights of from 1000 to 80 000;

2.7 adducts of ethylene oxide-propylene oxide with ethylenediamine.

3. Polymeric Dispersants and Protective Colloids

Suitable polymeric dispersants include, for example, amphiphilic copolymers, block copolymers and graft or comb polymers, especially those based on acrylic acid, methacrylic acid or salts thereof, hydroxyalkyl(meth)acrylic acid, aminoalkyl(meth)acrylic acid or salts thereof, 2-acrylamido-2-methylpropanesulfonic acid (AMPS) or salts thereof, maleic acid anhydride or salts thereof, (meth) acrylamide or substituted (meth)acrylamides, vinyl heterocycles, such as, for example, vinylpyrrolidone, vinylimidazole, and also amphiphilic polymers comprising segments of PEO or EO/PO copolymers.

Suitable protective colloids are, for example, polyvinyl alcohol, polyvinylpyrrolidone and copolymers thereof.

Also suitable are copolymers of synthetic monomers, especially of monomers containing carboxy groups, for example copolymers of 2-vinylpyrrolidone with 3-vinylpropionic acid or maleic acid copolymers and salts thereof.

Preferred dispersants are polymers based on maleic acid anhydride, polyvinyl alcohol or modified polyacrylates, for example the alkali salts, especially the sodium salts, of carboxylic acid copolymers or polyvinyl alcohol.

The invention accordingly relates also to an aqueous suspension comprising as component (b) polymers based on maleic acid anhydride, polyvinyl alcohol or modified polyacrylates, especially the alkali salts of carboxylic acid copolymers or polyvinyl alcohol.

The suspensions according to the invention may also comprise mixtures of various dispersants.

Further additives (d) may also be added to the suspensions according to the invention. Examples of such additives include thickeners, which stabilise the dispersions. Examples of suitable thickeners are, especially, modified polysaccharides of the xanthan, alginate, guar or cellulose type, and polyacrylate thickeners. These thickeners include, for example, cellulose ethers, for example methyl cellulose or carboxyrnethyl cellulose, and heteropolysaccharides, which contain mannose or glucuronic acid groups in the side-chains. Such thickeners are available commercially.

In addition to the dispersant and the thickener, the suspensions according to the invention may contain further adjuvants (d), such as hydrotropic agents, for example urea or sodium xylenesulfonate; antifreeze agents, such as ethylene glycol or propylene glycol, diethylene glycol, glycerol or sorbitol; humectants, such as polyethylene glycols or glycerol; biocides, such as chloroacetamide, formalin or 1,2-benzoisothiazolin-3one; or chelating agents, such as trisodium ndrilotriacetate.

Of particular importance is the addition of biocides especially fungicides, as component (d). The biocides are preferably used in an amount of from 0.05 to 0.5% by weight, based on the dispersion.

The invention accordingly relates also to aqueous dispersions comprising as component (d) at least one biocide.

The dispersions according to the invention may also comprise suitable light stabilisers. Especially suitable are compounds that do not adversely affect the particular photoinitiator in the dispersion. Such combinations of photoinitiators and light stabilisers are known to the person skilled in the art and are described in numerous publications. For example, compounds from the class of the hydroxyphenyltriazines or benzotriazoles are recommended, hydroxyphenyltriazines being preferred. These UV absorbers (UVA) are, where appropriate, used in combination with a sterically hindered amine (HALS). Examples of UV absorbers and sterically hindered amines may be found in the list provided hereinbelow. For example there may be used in the suspension according to the invention a combination of a) a mixture of 2-[4-[(2-hydroxy-3-dodecyloxypropyl)oxy]-2-hydroxyphenyl]-4,6-bis(2,4-dimethylphenyl)-1,3,5-triazine and 2-[4-[(2-hydroxy-3-tridecyloxypropyl)oxy]-2-hydroxyphenyl]-4,6-bis(2,4-dimethylphenyl)-1,3,5-tfiazine ($^{RTM}$TINUVIN 400, Ciba Spezialitätenchemie AG) as UVA and b) bis(1,2,2,6,6-pentamethyl-4-piperidinyl)sebacate ($^{RTM}$TINUVIN 292, Ciba Spezialitäterchemie) as HALS. The choice of UVA and/or HALS is governed by the absorption properties of the photoinitiator compound being used in coordination with the spectra of the UVA/HALS. The choice of suitable compounds is clear to the person skilled in the art and, as has already been mentioned, is described in publications, for example, by A. Valet, D. Wostratzky in Rad. Technol. Rep. 11-12 (1996) 18, and A. Valet in Progress in Organic Coatings 35 (1999) 223–233.

The invention accordingly relates also to suspensions as described hereinbefore comprising as additional component (d) at least one UV absorber and/or a sterically hindered amine.

The water (c) present in the suspensions according to the invention is advantageously added in deionised or distilled form, preferably deionised form.

The amount of component (a) in the photoinitiator suspension according to the invention is, for example, from 10 to 80 parts or from 20 to 70 parts, especially from 10 to 50 parts, e.g. from 25 to 45 parts, preferably from 40 to 50 parts, e.g. from 40 to 45 parts. Component (b) is added to the suspension, for example, in an amount of from 0.1 to 40 parts, from 0.1 to 10 parts, from 10 to 40 parts, from 15 to 40 parts, from 1 to 10 parts, e.g. from 3 to 8 parts, or from 4 to 5 parts. Depending on the amount of components (a) and (b), a sufficient number of parts of component (c) is added to the suspension for the total composition to amount to 100 parts. Component (c) is thus used, for example, to make up the total mixture to 100%.

The amount of the optional component (d) depends on the particular additive used. The amounts customary in the art are familiar to the person skilled in the art and are governed by the particular intended use.

The invention relates also to an aqueous suspension comprising from 10 to 80 parts of component (a); from 1 to 40 parts of component (b); and a sufficient number of parts of component (c) for the total composition to amount to 100 parts.

The suspensions according to the invention are prepared by (1) mixing together the above-described components (a), (b) and (c) and, optionally, further adjuvants (d), such as, for example, thickeners, light stabilisers (suitable compounds are further described hereinbelow in connection with photopolymerisable compositions) or biocides. The mixture is then first stirred until the solid material has been dispersed as uniformly as possible in the aqueous phase.

The stirring can be carried out in conventional mixing apparatus, especially in mixing apparatus in which a relatively strong pressure is exerted on the material being stirred. There may be used, for example, mixers having a stirring spindle, anchor mixers, turbine mixers, toothed mills, colloid mills or screw mixers.

Depending on the type of mixer employed, the time required to achieve effective blending of the components is from about half an hour to one hour. Stirring is preferably carried out at room temperature, but in certain cases it can be advantageous to cool the mixture slightly. After the first step of mixing the components, the mixture is, for example, coarsely ground in a further step (2). For that purpose the mixture is introduced into appropriate grinders. Suitable grinders for the grinding step, and for the grinding steps described hereinbelow, are generally known to the person skilled in the art. Suitable grinders for step (2) include, for example, toothed colloid mills, for example those from Fryma (Rheinfelden, Switzerland) which operate according to the stator/rotor principle. "Coarsely ground" in this context indicates that the solid material is brought by the grinding operation to a particle size of approximately from 50 to 150 μm, e.g. from 50 to 100 μm, especially from 50 to 60 μm.

During the grinding operation the temperature is advantageously maintained at from 10 to 30° C., especially from 20 to 25° C., that is, room temperature. In the pendulum procedure repeated three times, normally approximately 10 minutes are required to reach the mentioned particle size. The grinding time is not critical and can vary, depending on the amount of mixture to be ground, the only decisive factor being to achieve the desired particle size.

Finally, the particle size of the solid in the suspension according to the invention is advantageously brought by a fine-grinding step (3) to approximately from 0.1 μm to 12.0 μm, e.g. from 0.1 μm to 6 μm, especially from 0.1 μm to 4 μm. The median value at the end of the fine-grinding is advantageously a maximum of 2.5 μm, the largest particles being about 12 μm (in a proportion of 0.1%). The grinding is advantageously carried out using suitable grinders known to the person skilled in the art for example ball mills, such as continuously operating agitator ball mills having a grinding cylinder. The ball mills are advantageously charged with glass beads, agate beads or high quality alloy steel beads of, for example, 1 mm diameter. Advantageously, in order to achieve the desired particle size distribution a plurality of grinding operations, for example from 2 to 6, such as from 3 to 5 or, e.g. 3, grinding operations, each lasting approximately from 5 to 10 minutes, for example approximately from 7 to 8 minutes, is carried out per kg of suspension. The grinding time is generally not critical and can vary, depending on the amount of mixture to be ground, the only decisive factor being to achieve the desired particle size distribution.

The grinding is generally carried out at room temperature, for example from 20 to 30° C., the temperature of the suspension usually rising slightly during grinding, for example to from 30 to 35° C.

According to the invention, an aqueous suspension is also distinguished by a particle size of the solid or solids in the suspension of from 0.1 μm to 12 μm, especially from 0.1 μm to 4 μm.

The invention accordingly relates also to a process for the preparation of aqueous, storagestable, non-sedimenting photoinitiator suspensions comprising (a) at least one mono- or bis-acylphosphine oxide of formula I

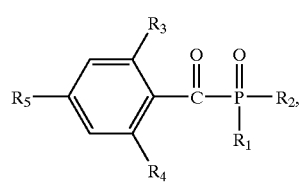

wherein $R_1$, $R_2$, $R_3$, $R_4$ and $R_5$ are as defined hereinbefore, (b) at least one dispersant, (c) water, and, optionally, (d) further additives by (1) suspending components (a), (b) and (c) and, optionally, (d), by stirring;

(2) coarse-grinding the resulting mixture to a particle size of the solid material in the suspension of approximately 60 μm; and (3) fine-grinding the mixture by one or more grinding operations to a particle size of the solid material in the suspension of less than 12 μm.

Depending on the constituents used, the suspension may already have the desired particle size distribution or stability after the stirring operation. In such cases steps (2) and (3) are superfluous to the preparation of suspensions according to the invention.

The suspensions according to the invention so obtained are storagestable for a long time at room temperature and can very readily be incorporated in that form into aqueous formulations that are to be polymerised. They comprise the photoinitiator in a heterogeneous phase, that is to say not dissolved in a constituent of the formulation but in solid form.

For use of the suspensions in aqueous media, it is of advantage that they can be handled as fluids and, for example, can be pumped for metered addition.

Despite the aqueous medium, the mono and bis-acylphosphine oxide compounds present therein remain stable and reactive.

In accordance with the invention, the suspensions of the acylphosphine oxide compounds can be used as photoinitiators in the photopolymerisation of compounds having ethylenic unsaturation or of mixtures comprising such compounds.

Such use can also be carried out in combination with another photoinitiator. Preferably, however, the suspension according to the invention is used as the sole photoinitiator.

The invention accordingly relates also to photopolymerisable compositions comprising (A) at least one ethylenically unsaturated photopolymerisable compound and (B) as photoinitiator, a suspension as described above, it being possible for the composition to contain, in addition to component (B), further additives (C).

The unsaturated compounds (A) may contain one or more olefinic double bonds. They may be low molecular weight (monomeric) or higher molecular weight (oligomeric). Examples of monomers having a double bond are alkyl and hydroxyalkyl acrylates and methacrylates, e.g. methyl, ethyl, butyl, 2-ethylhexyl and 2-hydroxyethyl acrylate, isobornyl acrylate and methyl and ethyl methacryaate. Also of interest are silicone acrylates. Further examples are acrylonitrile, acrylamide, methacrylamide, N-substituted (meth)acrylamides, vinyl esters, such as vinyl acetate, vinyl ethers, such as isobutyl vinyl ether, styrene, alkyl- and halostyrenes, N-vinylpyrrolidone, vinyl chloride and vinylidene chloride.

Examples of monomers having a plurality of double bonds are ethylene glycol diacrylate, propylene glycol diacrylate, neopentyl glycol diacrylate, hexamethylene glycol diacrylate and bisphenol-A diacrylate, 4,4'-bis(2-acryloyloxyethoxy)diphenylpropane, trimethylolpropane triacrylate, pentaerythritol triacrylate and pentaerythritol tetraacrylate, vinyl acrylate, divinylbenzene, divinyl succinate, diallyl phthalate, triallyl phosphate, triallyl isocyanurate and tris(2-acryloylethyl)isocyanurate.

Examples of higher-molecular-weight (oligomeric) polyunsaturated compounds are acrylated epoxy resins, acrylated or vinyl-ether- or epoxy-group-containing polyesters, polyurethanes and polyethers. Further examples of unsaturated oligomers are unsaturated polyester resins, which are usually produced from maleic acid, phthalic acid and one or more diols and have molecular weights of about from 500 to 3000. In addition it is also possible to use vinyl ether monomers and oligomers, and also maleate-terminated oligomers having polyester, polyurethane, polyether, polyvinyl ether and epoxide main chains. Combinations of vinyl-ether group-carrying oligomers and polymers, as described in WO 90/01512, are especially suitable, but copolymers of monomers functionalised with vinyl ether and maleic acid also come into consideration. Such unsaturated oligomers can also be termed prepolymers.

Especially suitable are, for example, esters of ethylenically unsaturated carboxylic acids and polyols or polyepoxides, and polymers having ethylenically unsaturated groups in the chain or in side groups, e.g. unsaturated polyesters, polyamides and polyurethanes and copolymers thereof, alkyd resins, polybutadiene and butadiene copolymers, polyisoprene and isoprene copolymers, polymers and copolyrners having (meth)acrylic groups in side chains, and also mixtures of one or more such polymers.

Examples of unsaturated carboxylic acids are acrylic acid, methacrylic acid, crotonic acid, itaconic acid, cinnamic acid and unsaturated fatty acids such as linolenic acid or oleic acid. Acrylic and methacrylic acid are preferred.

Suitable polyols are aromatic and especially aliphatic and cycloaliphatic polyols. Examples of aromatic polyols are hydroquinone, 4,4'-dihydroxydiphenyl, 2,2-di(4-hydmxyphenyl)propane, and novolaks and resols. Examples of polyepoxides are those based on the said polyols, especially the aromatic polyols and epichlorohydrin. Also suitable as polyols are polymers and copolymers that contain hydroxy groups in the polymer chain or in side groups, e.g. polyvinyl alcohol and copolymers thereof and polymethacrylic acid hydroxyalkyl esters or copolymers thereof. Further suitable polyols are oligoesters having hydroxy terminal groups.

Examples of aliphatic and cycloaliphatic polyols include alkylenediols having preferably from 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythrftol, dipentaerythritol and sorbitol.

The polyols may be partially or fully esterified with one or with different unsaturated carboxylic acid(s), It being possible for the free hydroxy groups in partial esters to be modified, for example etherified, or esterified with other carboxylic acids.

Examples of Esters are:

trimethylolpropane triacrylate, trimethylolethane triacryiate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythrilol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythrilol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylates and methacrylates, glycerol di- and triacrylate, 1,4-cyclohexane diacrylate, bisacrylates and bismethacrylates of polyethylene glycol having a molecular weight of from 200 to 1500, and mixtures thereof.

Also suitable as component (A) are the amides of identical or different unsaturated carboxylic acids and aromatic, cycloaliphatic and aliphatic polyamines having preferably from 2 to 6, especially from 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-paminoethyl ether, diethylenetriamine, triethylenetetramine and di(β-aminoethoxy)- and di(β-aminopropoxy)-ethane. Further suitable polyamines are polymers and copolymers which may have additional amino groups in the side chain and oligoamides having amino terminal groups. Examples of such unsaturated amides are: methylene bisacrylamide, 1,6-hexarnethylene bisacrylamide, diethylenetriamine trismethacrylamide, bis(methacrylamidopropoxy)ethane, β-methacrylamidoethyl methacrylate and N-[(β-hydroxyethoxy)ethyl]-acrylamide.

Suitable unsaturated polyesters and polyamides are derived, for example, from maleic acid and diols or diamines. The maleic acid may have been partially replaced by other dicarboxylic acids. They may be used together with ethylenically unsaturated comonomers, e.g. styrene. The polyesters and polyamides may also be derived from dicarboxylic acids and ethylenically unsaturated diols or diamines, especially from those having longer chains of e.g. from 6 to 20 carbon atoms. Examples of polyurethanes are those composed of saturated diisocyanates and unsaturated diols or unsaturated diisocyanates and saturated diois.

Polybutadiene and polyisoprene and copolymers thereof are known. Suitable comonomers include, for example, olefins, such as ethylene, propene, butene and hexene, (meth)acrylates, acrylonitrile, styrene and vinyl chloride. Polymers having (meth)acrylate groups in the side chain are likewise known. Examples are reaction products of novolak-based epoxy resins with (meth)acrylic acid; homo- or co-polymers of vinyl alcohol or hydroxyalkyl derivatives thereof that have been esterified with (meth)acrylic acid; and homo- and co-polymers of (meth)acrylates that have been esterified with hydroxyalkyl (meth)acrylates.

The photopolymerisable compounds (A) can be used on their own or in any desired mixtures. Preferably, mixtures of polyol (meth)acrylates are used.

Binders may also be added to the compositions according to the invention, this being particularly advantageous when the photopolymerisable compounds are liquid or viscous substances. The amount of binder may be, for example, from 5 to 95% by weight, preferably from 10 to 90% by weight and especially from 40 to 90% by weight, based on total solids. The choice of the binder is made in accordance with the field of use and the properties required therefor, such as developability in aqueous and organic solvent systems, adhesion to substrates and sensitivity to oxygen.

Suitable binders are, for example, polymers having a molecular weight of approximately from 5000 to 2 000 000, preferably from 10 000 to 1000 000. Examples are: homo- and copolymers of acrylates and methacrylates, e.g. copolymers of methyl methacrylatelethyl acrylatelmethacrylic acid, poly(methacrylic acid alkyl esters), poly(acrylic acid alkyl esters); cellulose esters and ethers, such as cellulose acetate, cellulose acetate butyrate, methylcellulose, ethylcellulose; polyvinyl butyral, polyvinyl formal, cyclised caoutchouc, polyethers such as polyethylene oxide, polypropylene oxide, polytetrahydrofuran; polystyrene, polycarbonate, polyurethane, chlorinated polyolefins, polyvinyl chloride, copolymers of vinyl chlorideIvinylidene chloride, copolymers of vinylidene chlorde with acrylonitrile, methyl methacrylate and vinyl acetate, polyvinyl acetate, copoly(ethyleneMnyl acetate), polymers such as polycaprolactam and poly(hexamethylene adipamide), polyesters such as poly(ethylene glycol terephthalate) and poly(hexamethylene glycol succinate).

The unsaturated compounds can also be used in admixture with non-photopolymerisable film-forming components. These may be, for example, polymers that can be dried physically or solutions thereof in organic solvents, for example nitrocellulose or cellulose acetobutyrate, but they may also be chemically or thermally curable resins, for example polyisocyanates, polyepoxides or melamine resins. The concomitant use of thermally curable resins is important for use in so-called hybrid systems, which are photopolymerised in a first step and crosslinked by thermal aftertreatment in a second step.

The photoinitiator suspensions according to the invention are also suitable as initiators for the curing of oxidatively drying systems, as described, for example, in Lehrbuch der Lacke und Beschichtungen Volume III, 296–328, Verlag W. A. Colomb in der Heenemann GmbH, Bertin-Oberschwandorf (1976).

Preferably, the aqueous photoinitiator suspensions according to the invention are used as photoinitiators in aqueous formulations that are to be polymerised.

The invention accordingly relates also especially to compositions comprising as component (A) at least one ethylenically unsaturated photopolymerisable compound dissolved or emulsified in water.

Such aqueous radiation-curable prepolymer dispersions are commercially available In many variations and are described in the literature. They are to be understood as being dispersions consisting of water and al least one prepolymer dispersed therein. The concentration of water in such systems is, for example, from 5 to 80% by weight, especially from 30 to 60% by weight. The radiation-curable prepolymer or mixture of prepolymers is present, for example, in concentrations of from 95 to 20% by weight, especially from 70 to 40% by weight. In such compositions, the sum of the percentages mentioned for water and prepolymer will be 100 in each case, the auxiliaries and additives, which will be present in varying amounts in accordance with the intended use, being in addition thereto.

The radiation-curable film-forming prepolymers, which are dispersed or in many cases dissolved in water, are mono- or poly-functional ethylenically unsaturated prepolymers such as, for example, are described above, that can be initiated by free radicals and are known per se for aqueous prepolymer dispersions, and that contain, for example, from 0.01 to 1.0 mol of polymerisable double bonds per 100 g of prepolymer and have an average molecular weight of, for example, at least 400, especially of from 500 to 10 000. Prepolymers having higher molecular weights may also be suitable, however, depending upon the intended use.

There are used, for example, polyrnerisable C—C double-bond-containing polyesters having an acid number of a maximum of 10, polymerisable C—C double-bond-containing polyethers, hydroxy-group-containing reaction products of a polyepoxide containing at least two epoxy groups per molecule with at least one α,β-ethylenically unsaturated carboxylic acid, polyurethane (meth)acrylates and acrylic copolymers containing α,β-ethylenically-unsaturated acrylic radicals, as described in EP 12 339. Mixtures of those prepolymers may also be used. Also suitable are the polymerisable prepolymers described in EP 33 896, which are thioether adducts of polymerisable prepolymers having an average molecular weight of at least 600, a carboxy group content of from 0.2 to 15% and a content of from 0.01 to 0.8 mol of polymerisable C—C double bonds per 100 g of prepolymer. Other suitable aqueous dispersions based on specific (meth)acrylic acid alkyl ester polymerisation products are described in EP 41 125, and suitable water-dispersible radiation-curable prepolymers of urethane acrylates can be found in DE 2 936 039. Further descriptions of aqueous, radiation-curable formulations have been published, for example, by H. Lange in Farbe +Lack, 99. Jahrgang, 7/93, pages 597–601 and by W. Reich, K. Menzel and W. Schrof in Farbe +Lack, 104. Jahrgang, 12/98, pages 73–80).

As further additives the radiation-curable aqueous prepolymer dispersions may comprise dispersion auxiliaries, emulsifiers, anti-oxidants, light stabilisers, colourants, pigments, fillers, e.g. talcum, gypsum, silicic acid, rutile, carbon black, zinc oxide, Iron oxides, reaction accelerators, flow agents, glidants, wetting agents, thickeners, dulling agents, antifoarns and other adjuvants customary in surface-coating technology. Suitable dispersion auxiliaries include water-soluble high-molecular-weight organic compounds having polar groups, e.g. polyvinyl alcohols, polyvinylpyrrolidone and cellulose ethers. As emulsifiers it Is possible to use non-ionic and, where appropriate, also ionic emulsifiers.

Attention is drawn to the fact that the photoinitlator dispersions according to the invention are just as outstandingly suitable as photoinitiators in non-aqueous coating systems as described further above.

The photopolymerisable mixtures may also contain various additives (C) in additon to the photoinitiator (B). Examples thereof are thermal inhibitors, which are intended to prevent pre mature polymerisation, e.g. hydroquinone, hydroquinone derivatives, p-methoxphenol, β-naphthol or sterically hindered phenols, e.g. 2,6-di(tert-butyl)-p-cresol. In order to increase dark-storage stability it is possible to use, for example, copper compounds, such as copper naphthenate, stearate or octoate, phosphorus compounds, for example triphenylphosphine, tributylphosphine, triethyl phosphite, triphenyl phosphite or tribenzyl phosphite, quatemary ammonium compounds, e.g. tetramethylammonium chloride or trimethylbenzylammonium chloride, or hydroxylamine derivatives, e.g. N-diethylhydroxylamine. For the purpose of excluding atmospheric oxygen during polymerisation it is possible to add paraffin or similar wax-like substances which, being insoluble in the polymer, migrate to the surface at the beginning of the polymersation and form a transparent surface layer which prevents air from entering. Equally possible is the application of a layer that is impermeable to oxygen. As light stabilisers it is possible to add UV absorbers, e.g. those of the hydroxyphenylbenzotriazole, hydroxyphenylbenzophenone, oxalic acid amide or hydroxyphenyl-s-triazine type. Such compounds can be used on their own or in the form of mixtures, with or without the use of sterically hindered amines (HALS).

The following are examples of such UV absorbers and light stabilisers:

1. 2-(2'-Hydroxyphenyl)-benzotriazoles, e.g. 2-(2'-hydroxy-5'-methylphenyl)-benzotriazole, 2-(3',5'-di-tertbutyl-2'-hydroxyphenyl)-benzotriazole, 2-(5'-tert-butyl-2'-hydroxyphenyl)-benzotriazole, 2-(2'-hydroxy-5'-(1,1,3,3-tetramethylbutyl)-phenyl)-benzotriazole, 2-3',5'-di-tert-butyl-2'-hydroxyphenyl)-5-chlorobenzotriazole, 2-(3'-tert-butyl-2'-hydroxy-5'-methylphenyl)-5-chlorobenzotriazole, 2-(3'-sec-butyl-5'-tert-butyl-2'-hydroxyphenyl)-benzotriazole, 2-(2'-hydroxy-4'-octyloxyphenyl)-benzotriazole, 2-(3',5'-di-tert-amyl-2'-hydroxyphenyl)-benzotriazole, 2-(3',5'-bis(α,α-dimethylbenzyl)-2'-hydroxyphenyl)benzotriazole, a mixture of 2-(3'-tert-butyl-2'-hydroxy-5'-(2-octyloxycarbonylethyl)-phenyl)-5-chlorobenzotriazole, 2-(3'-tert-butyl-5'-[2-(2-ethylhexyloxy)-carbonylethyl]-2'-hydroxyphenyl)-5-chlorobenzotriazole, 2-(3'-tert-butyl-2'-hydroxy-5'-(2-methoxycarbonylethyl)-phenyl)-5-chlorobenzotniazole, 2-(3'-tert-butyl-2'-hydroxy-5'-(2-methoxycarbonylethyl)-phenyl)-benzotriazole, 2-(3'-tert-butyl-2'-hydroxy-5'-(2-octyloxycarbonylethyl)-phenyl)-benzotriazole, 2-(3'-tert-butyl-5'-[2-(2-ethylhexyloxy)-carbonyl-ethyl]-2'-hydroxyphenyl)-benzotriazole, 2-(3'-dodecyl-2'-hydroxy-5'-methylphenyl)-benzotriazole and 2-(3'-tert-butyl-2'-hydroxy-5-(2-isooctyloxycarbonylethyl)-phenyl-benzotriazole, 2,2'-methylene-bis[4-(1,1,3,3-tetramethylbutyl)-6-benzotriazol-2-yl-phenol]; the transesterification product of 2-[3'-tert-butyl-5'-(2-methoxycarbonylethyl)-2'-hydroxyphenyl]-benzotriazole with polyethylene glycol 300; [R—CH$_2$~CH$_2$—COO(CH$_2$)$_3$]$_2$— wherein R=3'-tert-butyl-4'-hydroxy-5'-2H-benzotriazol-2-yl-phenyl.

2. 2-Hydroxybenzophenones, e.g. a 4-hydroxy, 4-methoxy, 4octyloxy, 4-decyloxy, 4-dodecyloxy, 4-benzyloxy, 4,2',4'-trihydroxy or 2'-hydroxy-4,4'-dimethoxy derivative.

3. Esters of unsubstituted or substituted benzoic acids, e.g. 4-tert-butyl-phenyl salicylate, phenyl salicylate, octylphenyl salicylate, dibenzoylresorcinol, bis(4-tert-butylbenzoyl) resorcinol, benzoylresorcinol, 3,5-di-tert-butyl-4-hydroxybenzoic acid 2,4-di-tert-butylphenyl ester, 3,5-di-tert-butyl-4-hydroxybenzoic acid hexadecyl ester, 3,5-di-tert-butyl-4-hydroxybenzoic acid ocladecyl ester and 3,5-di-tert-butyl-4-hydroxybenzoic acid 2-methyl-4,6-di-tert-butylphenyl ester.

4. Acrylates, e.g. α-cyano-β,β-diphenylacrylic acid ethyl ester or isooctyl ester, α-methoxycarbonylcinnamic acid methyl ester, α-cyano-β-methyl-p-methoxycinnamic acid methyl ester or butyl ester, α-methoxycarbonyl-p-methoxycinnamic acid methyl ester and N-(β-methoxycarbonyl-β-cyanovinyl)-2-methyl-indoline.

5. Sterically hindered amines, e.g. bis(2,2,6,6-tetramethylpiperidyl)sebacate, bis(2,2,6,6-tetramethylpiperidyl)succinate, bis(1,2,2,6,6-pentamethylpiperidyl)sebacate, n-butyl-3,5-di-tert-butyl-4-hydroxybenzylmalonic acid bis(1,2,2,6,6-pentamethylpiperidyl) ester, the condensation product of 1-hydroxyethyl-2,2,6,6-tetramethyl-4-hydroxypipsridine and succinic acid, the condensation product of N,N'-bis(2,2,6,6-tetramethyl-4-piperidyl)hexamethylenediamine and 4-tert-octylamino-2,6-dichloro-1,3,5-s-triazine, tris(2,2,6,6-tetramethyl-4-piperidyl)nitrilotriacetate, letrakis(2,2,6,6tetramethyl-4-piperidyl)-1,2,3,4-butanetetraoate, 1,1'-(1,2-ethanediyl)-bis(3,3,5,5-tetramethylpiperazinone), 4-benzoyl-2,2,6,6-tetrarnethylpiperidine, 4-stearytoxy-2,2,6,6-tetramethylpiperidine, bis(1,2,2,6,6-pentamethy (piperidyl)2-n-butyl-2-(2-hydroxy-3,5-di-tert-butylbenzyl)-maIonate, 3-n-octyl-7,7,9,9-tetramethyl-1,3,8-triazaspiro [4.5]decane-2,4-dione, bis(1-octyloxy-2,2,6,6tetramethylpiperidyl)sebacate, bis(1-octyloxy-2,2,6,6-tetramethylpiperidyl)succinate, the condensation product of N,N'-bis(2,2,6,6-tetramethyl-4-piperidyl) hexamethylenediamine and 4-morpholino-2,6dichloro-1,3,5-triazine, the condensation product of 2-chloro-4,6-di(4-n-butylamino-2,2,6,6-tetramethylpiperidyl)-1,3,5-triazine and 1,2-bis(3-aminopropylamino)ethane, the condensation product of 2-chloro-4,6-di(4-n-butylamino-1,2,2,6,6-pentamethylpiperidyl)-1,3,5triazine and 1,2-bis(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)-pyrrolidine-2,5-dione and 3-dodecyl-1-(1,2,2,6,6-pentamethyl-4-piperidyl)-pyrrolidine-2,5-dione.

6. Oxalic acid diamides, e.g. 4,4'-dioctyloxy-oxanilide, 2,2'-diethoxy-oxanilide, 2,2'-dioctyl-oxy-5,5'-di-tert-butyl oxanilide, 2,2'-didodecyloxy-5,5'-di-tert-butyl oxanilide, 2-ethoxy-2'-ethyl oxanilide, N,N'-bis (3dimethylaminopropyl)oxalamide, 2-ethoxy-5-tert-butyl-2'-ethyl oxanitide and a mixture thereof with 2-ethoxy-2'-ethyl-5,4'-dl-tert-butyl oxanilide and mixtures of o- and p-methoxy- and of o- and p-ethoxy-disubsttuted oxanilides.

7. 2-(2-Hydroxyphenyl)-1,3,5-triazines, e.g. 2,4,6-tris(2-hydroxy4 ctyloxyphenyl)-1,3,5-triazine, 2-(2-hydroxy-4-octyloxyphenyl)-4,6-bis(2,4-dimethylphenyl)-1,3,5triazine, 2-(2,4-dihydroxyphenyl)-4,6-bis(2,4-dimethylphenyl)-1,3,5-triazine, 2,4is(2-hydroxy-4-propyloxy-phenyl)(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-[2-hydroxy-4-(2-hydroxy-3-butyloxy-propyloxy)-phenyl]-4,6-bis(2,4-dimethylphenyl)-1,3,5-triazine, 2-[2-hydroxy-4-(2-hydroxy-3-octyloxy-propyloxy)-phenyl]-4,6-bis(2,4-dimethylphenyl)-1,3,5-triazine and 2-[4-dodecyloxy/tridecyloxy-(2-hydroxypropyl)oxy-2-hydroxy-phenyl]-4,6-bis(2,4-dimethylphenyl)-1,3,5-triazine.

8. Phosohites and phosphonites, e.g. triphenyl phosphite, diphenylalkyl phosphites, phenyldialkyl phosphites, tris (nonylphenyl)phosphite, trilauryl phosphite, trioctadecyl phosphite, distearyl-pentaerythritol diphosphite, tris(2,4-di-tert-butylphenyl)phosphite, diisodecylpentaerythritol diphosphite, bis(2,4-di-tert-butylphenyl)pentaerythritol diphosphite, bis(2,6-di-tert-butyl-4-meihylphenyl) pentaerythritol diphosphite, bis-isodecyloxy-pentaerythritol diphosphite, bis(2,4-di-tert-butyl-6-methylphenyl) pentaerythrtol diphosphite, bis(2,4,6-tri-tert-butylphenyl)-pentaerythritol diphosphite, tristearyl sorbitol triphosphite, tetrakis(2,4-di-tert-butylphenyl)-4,4'-biphenylene diphosphonite, 6-isooctyloxy-2,4,8,10-tetra-tert-butyl-12H-dibenzo[d,g]-1,3,2-dioxaphosphocine, 6-fluoro-2,4,8,10-tetra-tert-butyl-12-methyl-dibenzo[d,g]-1,3,2-dioxaphosphocine, bis(2,4-di-tert-butyl-6-methylphenyl) methyl phosphite and bis(2,4-di-tert-butyl-6-methylphenyl) ethyl phosphite.

Also of interest in this connection are, especially, water-soluble NOR-HALS stabiliser compounds, which can be incorporated as additives into the photoinitiator suspension according to the invention directly, or can be added as additives to the polymerisable mixtures.

Examples of such water-soluble NOR-HALS stabiliser compounds are derivatives of 1-oxyl-2,2,6,6-tetramethylpiperidin4-ol and their hydroxylamine salts, for example compounds of formula

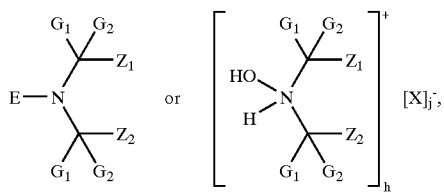

wherein
- $G_1$ and $G_2$ are each independently of the other $C_1$–$C_4$alkyl or are together pentamethylene; $Z_1$ and $Z_2$ are each methyl, or $Z_1$ and $Z_2$ together form a linking group that may additionally be substituted by an ester, ether, hydroxy, oxo, cyanohydrin, amide, amino, carboxy or urethane group;
- E is oxyl; hydroxy; hydrogen; alkyl; alkyl substituted by hydroxy, oxo or carboxy or interrupted by oxygen or carboxy; alkenyl; alkynyl; cycloalkyl; cycloalkenyl; bicycloalkyl; alkoxy; alkoxy substituted by hydroxy, oxo or carboxy or interrupted by oxygen or carboxy; cycloalkoxy; alkenyloxy; cycloalkenyloxy; aralkyl; aralkoxy; acyl; R'(C=O)O—; R'O(C=O)O—; R'N(C=O)O— or chlorine, wherein R' is an aliphatic or aromatic radical;
- X is an inorganic or organic anion; and
- wherein the total charge of the cations h is equal to the total charge of the anions j.

Examples of such compounds are as follows:
bis(1-oxyl-2,2,6,6-tetramethylpiperidin-4-yl)sebacate; bis(1-hydroxy-2,2,6,6-tetramethyl-piperidin-4-yl)sebacate; 1-hydroxy-2,2,6,6-tetramethyl-4-acetoxypiperidinium citrate; 1-oxyl-2,2,6,6-tetramethyl-4-acetamidopiperidine; 1-hydroxy-2,2,6,6-tetramethyl-4-acetamidopiperidine; 1-hydroxy-2,2,6,6-tetramethyl-4-acetamidopiperidinium bisultate; 1-oxyl-2,2,6,6-tetramethyl-4-oxo-piperidine; 1-hydroxy-2,2,6,6-tetramethyl-4-oxo-piperidine; 1-hydroxy-2,2,6,6-tetramethyl4-oxo-piperidinium acetate; 1-oxyl-2,2,6,6-tetramethyl-4-methoxypiperidine; 1-hydroxy-2,2,6,6-tetramethyl-4-methoxy-piperidine; 1-hydroxy-2,2,6,6-tetramethyl-4-methoxy-piperidinium acetate; 1-oxyl-2,2,6,6-tetramethyl4-acetoxypiperidine; 1-hydroxy-2,2,6,6-tetramelhyl-4-acetoxypiperidine; 1-oxyl-2,2,6,6-tetramethyl-4-propoxy-piperidine; 1-hydroxy-2,2,6,6-tetramethyl-4-propoxy-piperidinium acetate; 1-hydroxy-2,2,6,6-tetramethyl-4-propoxy-piperidine; 1-oxyl-2,2,6,6-tetramethyl-4-(2-hydroxy4-oxapentyloxy)-piperidine; 1-hydroxy-2.2,6,6-tetramethyl-4-(2-hydroxy-4-xapentyloxy)piperidinium acetate; 1-oxyl-2,2,6,6-tetramethyl-4hydroxypiperidine; 1-hydroxy-2,2,6,6-tetramethyl-4-hydroxypiperidine; 1-hydroxy-2,2,6,6-tetramethyl4ihydroxypiperidinium chloride; 1-hydroxy-2,2,6,6-tetramethyl-4-hydroxypiperidinium acetate; 1-hydroxy-2,2,6,6-tetramethyl-4-hydroxypiperidinium bisulfate; 1-hydroxy-2,2,6,6-tetramethyl-4-hydroxypiperidinium citrate; bis(1-hydroxy-2,2,6,6-tetramethyl-4-hydroxypiperidinium)citrate; tris(1-hydroxy-2,2,6,6-tetramethyl-4-hydroxypiperdinium)citrate; tetra(1-hydroxy-2,2,6,6-tetramethyl4-hydroxypiperidinium)-ethylenediamine tetraacetate; tetra(1-hydroxy-2,2,6,6-tetramethyl-4-acetarnidopiperidinium)-ethylenediamine tetraacetate; tetra(1-hydroxy-2,2,6,6-tetramethyl-4-oxopiperidinium)-ethylenediamine tetraacetate; penta(1-hydroxy-2,2,6,6-tetramethyl4-hydroxypiperidinium)-diethylenetriamine pentaacetate; penta(1-hydroxy-2,2,6,6-tetramethyl4-acetamidopiperidinium)diethylenetriamine pentaacetate; penta(1-hydroxy-2,2,6,6-tetramethyk4-oxopiperidinium)diethylenetriamine pentaacetate; tri(1-hydroxy-2,2,6,6-tetramethylhydroxypiperidinium) nitrilotriacetate; tri(1-hydroxy-2,2,6,6-tetramethyl-4-acetamidopiperidinium)nitrilotriacetate; tri(1-hydroxy-2,2,6,6-tetramethyl-4-oxopiperidinium)nitrilotriacetate; penta(1-hydroxy-2,2,6,6-tetrarrethyt4-hydroxypiperidinium)diethylenetriamine pentarnethylenephosphonate; penta(1-hydroxy-2,2,6,6-tetramethyl-4-acetarnidopiperidinium)diethylenetriamine pentamethylenephosphonate; penta(1-hydroxy-2,2,6,6-tetra methyl-4-oxopiperidinium) diethylenetriamine pentamethylenephosphonate.

Also advantageous is the addition of biocides, as further additives (C), to the compositions according to the invention. Compounds known to the person skilled in the art and customary in the art are suitable. Examples include chloroacetamide, formalin and 1,2-benzo-isothiazolin-3-one or also fungicides. The biocides are added, for example, in an amount of from 0.05 to 0.5% by weight.

The biocides can also be added directly to the above-described photoinitiator dispersion according to the invention and incorporated with that dispersion into the composition to be polymerised.

Additives customary in the art, such as, for example, antistatic agents, flow improvers and adhesion promoters, may also be used.

In order to accelerate the photopolymerisation, there may be added as further additives (C) amines, such as, for example, triethanolamine, N-methyl-diethanolamine, p-dimethylaminobenzoic acid ethyl ester or Michler's ketone. The action of the amines can be enhanced by the addition of aromatic ketones of the benzophenone type. Amines suitable for use as oxygen capture agents are, for example, substituted N,N-dialkylanilines, as described in EP 339 841. Further accelerators, co-initiators and auto-oxidisers are thiols, thioethers, disulfides and phosphines, as described e.g. in EP 438 123 and GB 2 180 358.

It is also possible to add chain transfer reagents customary in the art to the compositions according to the invention. Examples include mercaptans, amines and benzothiazole.

Photopolymerisation can also be accelerated by the addition, as further additives (C), of photosensitisers that shift or broaden the spectral sensitivity. These include especially aromatic carbonyl compounds, e.g. benzophenone, thioxanthone, especially isopropylthioxanthone, anthraquinone and 3-acylcoumarin derivatives, terphenyls, styryl ketones, and also 3-(aroylmethylene)-thiazolines, camphorquinone, and also eosin, rhodamine and erythrosine dyes.

There may also be considered as photosensitisers, for example, the abovementioned amines.

The curing process, especially in the case of pigmented compositions (e.g. compositions pigmented with titanium dioxide), may also be assisted by the addition, as additional additive (C), of a component that forms free radicals under thermal conditions, e.g. an azo compound, such as 2,2'-azobis(4-melhoxy-2,4dimethylvaleronitrile), a triazene, diazosulfide, pentazadiene or a peroxy compound, for example a hydroperoxide or peroxycarbonate, e.g. tert-butyl hydroperoxide, as described e.g. in EP 245 639.

The compositions according to the invention may also comprise as further additive (C) a photoreproducible dye, e.g. a xanthene, benzoxanthene, benzothioxanthene, thiazine, pyronine, porphyrin or acridine dye, and/or a radiation-cleavable trihalomethyl compound. Similar materials are described, for example, in EP 445 624.

Further customary additives (C) are—depending upon the intended use—optical brighteners, fillers, thickeners, pigments, colourants, wetting agents and flow improvers.

The addition of glass microbeads or pulverised glass fibres, as described, for example, in U.S. Pat. No. 5,013,768, is suitable for the curing of thick and pigmented coatings.

The choice of additives depends on the field of application and the properties desired for that field. The above-described additives (C) are customary in the art and are accordingly used in the amounts customary in the art.

The formulations may also comprise as additional additives (C) colourants and/or white or coloured pigments. Depending upon the intended use, both inorganic and organic pigments may be used. Such additives are known to the person skilled in the art; a few examples are: titanium dioxide pigments, for example of the rutile or anatase type, carbon black, zinc oxide, such as zinc white, iron oxides, such as iron oxide yellow, iron oxide red, chromium yellow, chromium green, nickel titanium yellow, ultramarine blue, cobalt blue, bismuth vanadate, cadmium yellow and cadmium red. Examples of organic pigments are mono- or bis-azo pigments, and also metal complexes thereof, phthalocyanine pigments, polycyclic pigments, e.g. perylene, anthraquinone, thioindigo, quinacridone or triphenylmethane pigments, and also diketo-pyrrolo-pyrrole, isoindolinone, e.g. tetrachloroisoindolinone, isoindoline, dioxazine, benzimidazolone and quinophthalone pigments.

The pigments may be used in the formulations on their own or in admixture,

Depending upon the intended use, the pigments are added to the formulations in amounts customary in the art, for example in an amount of from 0.1 to 60% by weight, for example from 1 to 60% by weight, e.g. from 10 to 50 or from 10 to 40% by weight, based on the total mass.

The formulations may also comprise, for example, organic dyes of an extremely wide variety of classes. Examples are azo dyes, methine dyes, anthraquinone dyes and metal complex dyes. Customary concentrations are, for example, from 0.1 to 20%, especially from 1 to 5% by weight, based on the total mass.

In certain cases it may be advantageous to use further known photoinitiators as further additives. Examples of such compounds are benzophenone, benzophenone derivatives, e.g. 2,4,6-trimethylbenzophenone, 2-methylbenzophenone, 3-methylbenzophenone, 4-methylbenzophenone, 4,4'-bis(chloromethyl)benzophenone, 4chlorobenzophenone, 4-phenylbenzophenone, 3,3'-dimethyl-4-methoxybenzophenone, [4-(4-methylphenylthio)phenyl]-phenylmethanone, methyl 2-benzoylbenzoate, acetophenone, acetophenone derivatives, e.g. $\alpha$-hydroxycycloalkylphenyl ketone or 2-hydroxy-2-methyl-1-phenyl-propanone, dialkoxyacetophenone, $\alpha$-hydroxy- or $\alpha$-amino-acetophenone, e.g. (4-methylthiobenzoyl)-1-methyl-1-morpholincethane, (4-morpholincbenzoyl)-1-benzyl-1-dimethylaminopropane, 4-aroyl-1,3-dioxolane, benzoin alkyl ethers and benzil ketal, e.g. benzil dimethyl ketal, phenyl glyoxalate and derivatives thereof, dimeric phenyl glyoxalates, further monoacylphosphine oxides, e.g. (2,4,6-trimethylbenzoyl)phenyl-phosphtne oxide, (2,4,6-trimethylbenzoyt)ethoxy-phosphine oxide, further bisacylphosphine oxides, e.g. bis(2,6-dimethoxybenzoyl)(2,4,4-trimethyl-pent-1-yl)phosphine oxide, bis(2,4,6-trimethylbenzoyl)phenyl-phosphine oxide or bis(2,4,6-trimethylbenzoyl)-(2,4-dipentyloxyphenyl)phosphine oxide, trisacylphosphine oxides, ferrocenium compounds or titanocenes, e.g. dicyclopentadienyl-bis(2,6-difluoropyrrolo-phenyl)titanium.

When the photoinitiator suspensions according to the invention are used in systems that comprise both free-radically polymerisable and cationically polymerisable components, there are added to the suspensions according to the invention comprising free-radical hardeners, in addition, cationic photoinitiators, e.g. aromatic sulfonium, phdsphonium or iodonium salts, as described, e.g. in U.S. Pat. No. 4,950,581, column 18, line 60 to column 19, line 10, or cyclopentadienylarene-iron(II) complex salts, e.g. ($\eta^6$-isopropylbenzene)($\eta^5$-cyclopentadienyl)iron(II) hexafluorophosphate. It is also possible for peroxides, e.g. benzoyl peroxide, to be added (other suitable peroxides are described in U.S. Pat. No. 4,950,581, column 19, lines 17 to 25).

The photopolymerisable compositions contain the photoinitiator (a) advantageously in an amount of from 0.05 to 15% by weight, preferably from 0.1 to 5% by weight, based on the composition. Accordingly, it is necessary in each case for an appropriately calculated amount of the photoinitiator suspension according to the invention to be added. The calculation of the required amount of suspension in each particular case is trivial to the person skilled in the art.

The above-indicated amount of photoinitiator relates to the total amount of all photoinitiator compounds added when mixtures thereof are used, that is to say, if photoinitiators are added as additional additives (C), they are included in the amount indicated above.

The photopolymerisable compositions may be used for a variety of purposes, for example as printing inks, e.g. for screen printing, offset printing and flexographic printing, as clear lacquers, as white surfacecoating compositions, for example for wood or metal, as coating materials inter alia for paper, wood, metal or plastics, as daylightcurable paints for marking structures and roads, for photographic reproduction processes, or for the production of printing plates that can be developed using organic solvents or using aqueous-alkaline media, as photoresists.

The photoinitiator suspensions according to the invention may also be used as initiators in emulsion polymerisation, bead polymeisation or suspension polymerisation or as initiators of polymerisation for fixing orientation states of liquid-crystalline monomers and oligomers or as initiators for fixing dyes on organic materials. The photoinitmator suspensions according to the invention can also be used as initiators for polymerisation in solution, especially in aqueous solution, for example in the polymerisation of water-soluble monomers, e.g. acrylic acid and salts thereof. This results in polymers that are able to absorb large amounts of water (super-absorbers). Such polymers have a wide variety of uses, for example in hygiene articles, e.g. diapers, for water purification and water treatrnent, or as water stores in the ground, as described, e.g. in Chemische Industrie 11, page 12, (1996).

Unsaturated polyester resins are generally used in two-component systems together with a monounsaturated monomer, preferably styrene. For photoresists, specific one-component systems are often used, e.g. polyrnaleinimides, polychalcones or polyimides, as described in DE 2 308 830.

The photocurable compositions according to the invention are suitable, for example, as coating materials for all kinds of substrate, for example wood, textiles, paper, ceramics, glass, plastics, such as polyesters, polyethylene terephthalate, polyolefins and cellulose acetate, especially in the form of films, and also metals, such as Al, Cu, Ni, Fe, Zn, Mg or Co and GaAs, Si or $SiO_2$, to which a protective layer is to be applied or an image is to be applied by imagewise exposure.

The substrates can be coated by applying a liquid composition, a solution or a suspension to the substrate. The choice of solvent and concentration are governed chiefly by the nature of the composition and the coating method. The solvent should be inert, that is to say it should not enter into any chemical reaction with the components, and it should be capable of being removed again after the coating operation during drying, Suitable solvents include, for example, water, ketones, ethers and esters, such as methyl ethyl ketone, isobutyl methyl ketone, cyclopentanone, cyclohexanone, N-methylpyrrolidone, dioxane, tetrahydrofuran, 2-methoxyethanol, 2-ethoxyethanol, 1-methoxy-2-propanol, 1,2-dimethoxyethane, ethyl acetate, n-butyl acetate and ethyl 3ethoxypropionate.

The formulation is applied uniformly to a substrate by means of known coating methods, for example by spin-coating, immersion, knife coating, curtain pouring, brush application or spraying, especially by electrostatic spraying and reverse-roll coating, or by electrophoretic deposition. It is also possible to apply the photosensitive layer to a temporary flexible support and then coat the final substrate, e.g. a copper-clad circuit board, by transferring the layer by lamination.

The amount applied (layer thickness) and nature of the substrate (layer support) depend upon the desired field of use. The layer thickness range generally includes values of, for example, from approximately 0.1 µm to more than 100 mm, or, for example, from 0.02 to 2 cm. Preferably, the photoinitiator suspensions according to the invention are used in aqueous surface-coating formulations. The layer thickness range for that application includes, for example, from 0.1 µm to 500 µm, especially from 1 µm to 200 µm.

As has already been mentioned, the compositions according to the invention can also be used to produce a photoresist, which is obtained by "imagewise" exposure, that is to say exposure using a photomask having a predetermined pattern, e.g. a transparency, or exposure using a laser beam which is moved over the surface of the coated substrate, for example under computer control, and in that way produces an image, or irradiation with computer controlled electron beams, and subsequent development and, optionally, thermal treatment. Such methods are known to the person skilled in the art.

Photocuring is of great importance also for printing inks, since the drying time of the binder is a determining factor in the rate of production of graphic products and should be of the order of fractions of a second. UV-curable inks that comprise photoinitiator suspensions according to the invention are important especially for screen printing, offset printing and flexographic printing.

Another field of use for photocuring is metal coating, for example in the application of a finish to sheets and tubes, cans, or bottle closures, and also photocuring on plastics coatings, for example of PVC-based floor or wall coverings. Examples of the photocuring of paper coatings include the application of a colourless finish to labels, record sleeves or book covers.

The photoinitiator suspensions according to the invention are most especially suitable in aqueous formulations as coatings or for the preparation of coatings, and especially also for external applications (fixed objects) where curing by daylight "outside-light curing" is also especially important. In such cases, preference is given to binders that, after the water content has evaporated off, yield wipe-resistant and non-tacky coatings. It will be understood that, especially in the case of external applications, light stabilisers, which protect the surfacecoating layer and substrate from photodegradation, may also be used. The light stabilisers may either be directly incorporated into the aqueous photoinitiator suspension when the latter is being prepared, or may be admixed, as a further additive (C), with the formulation to be photopolymerised.

The aqueous photoinhtiator suspensions according to the invention are also important as initiators in formulations for external use, e.g. exterior paints or roof coatings. For such a use, it is important in the case of a latex-type coating for the surface to be non-tacky after a relatively short time of photocrosslinking with outside light, so that no dust particles can stick. Such formulations may also comprise light stabilisers of the UV-absorber or sterically-hindered-amine (HALS) type.

Aqueous photoinitiator suspensions according to the invention are also suitable as initiators in "dual-cure" processes. "Dual-cure" in this context is to be understood as the combination of two curing processes in a surface-coating system that involve different chemical mechanisms. Such "dual-cure" systems may likewise comprise light stabilisers of the type described above. In that way relatively soft and flexible coatings having a high degree weather resistance can be obtained.

A further advantage is that, when the photoinitiator suspensions according to the invention are used, the photopolymerisation of monomers in aqueous solution is possible using relatively simple day-light-like light sources. Such processes are, for example, of interest for the preparation of polymers that are able to absorb large amounts of water (super-absorbers).

Acrylate dispersions that can be dried physically generally have a low resistance to water and organic liquids (e.g. ethanol), and, similarly, the blocking resistance (tendency to stick when subjected to pressure) of such formulations is usually low. Resistance and blocking resistance can be increased by the addition of aqueous, UV-curable binder formulations that comprise the aqueous photoinitator suspensions according to the invention. Such formulations are called hybrid systems, because two different crosslinking processes, that is to say a physical and a chemical crosslinking process, are combined.

The photosensitivity of the preferably aqueous photocurable compositions according to the invention usually extends from approximately 200 nm to approximately 600 nm (UV range). Suitable radiation, for example, comprises sunlight or light from artificial light sources. A large number of the most varied types of light source accordingly come into consideration for use. Both point sources and platform radiators (lamp carpets) are suitable. Examples are: carbon arc lamps, xenon arc lamps, medium pressure, high pressure and low pressure mercury radiators, doped, where appropriate, with metal halides (metal halide lamps), microwave excited metal vapour lamps, excimer lamps, superactinic fluorescent tubes, fluorescent lamps, argon incandescent lamps, flash lamps, photographic floodlight lamps, light-emitting diodes (LED), electron beams and X-rays. The distance between the lamp and the substrate according to the invention to be exposed may vary according to the intended use and the type and strength of the lamp and may be, for example, from 2 cm to 150 cm. Also suitable are, for example, laser light sources, e.g. excimer lasers, such as Krypton-F lasers for exposure at 248 nm. Lasers in the visible range may also be used. Using this method, it is possible to produce printed circuits for the electronics industry, lithographic offset printing plates or relief printing plates, and also photographic image-recording materials.

The invention accordingly relates also to a process for the photopolymerisation of non-volatile monomeric, oligomeric or polymeric compounds having at least one ethylenically unsaturated double bond, which comprises irradiating a composition as described above with light in the range from 200 to 600 nm.

The invention relates also to the use of the above-described composition in, and to a process for, the production of surface coatings, printing inks, screen-printing inks, offset-printing inks, flexographic-printing inks, resist materials or image-recording material, especially for corresponding aqueous systems.

The invention relates likewise to a coated substrate that is coated on at least one surface with a composition as described above.

The following Examples further illustrate the invention. Unless otherwise indicated, parts and percentages, both in the remainder of the description and in the patent claims, relate to weight. When alkyl or alkoxy radicals having more than three carbon atoms are mentioned without reference to their isomeric form, the statements relate to the respective n-isomers.

EXAMPLE 1

Preparation of an Aqueous Photoinitiator Formulation (D1)

[40% bis(2,4,6-trimethylbenzoyl)phenylphosphine oxide, $^{RTM}$IRGACURE 819, CibaSpezialitätenchemie AG; 4% dispersing agent sodium salt of a carboxylic acid copolymer, $^{RTM}$OROTAN 731 DP, Rohm+Haas Company; 0.1% bactericide, 1,2-benzoisothiazol-3one, $^{RTM}$PROXEL BD, Novartis AG; 55.9% water (deionised)].

1.1 Preparation of the Suspension

In a glass beaker with an anchor stirrer, 0.65 g of bactericide ($^{RTM}$PROXEL BD) and 26.00 g of dispersing agent ($^{RTM}$OROTAN DP 731) are dissolved in 363.40 g of deionised water at room temperature, with stirring.

260.0 g of bis(2,4,6-trimethylbenzoyl)phenylphosphine oxide are introduced into the resulting solution and the batch is stirred for approximately one hour, yielding 650 9 of an aqueous suspension.

1.2 Preliminary Grinding

At room temperature, the suspension obtained in accordance with Example 1.1 is preground by means of a cross-toothed colloid mili (stator-rotor principle, water-cooled; Fryma AG Maschinenbau, Rheintelden, Switzerland) three times in the pendulum procedure at the narrowest grinding gap setting. During the course of the operation the temperature of the suspension does not exceed 35° C. After the grinding operation the largest particles of the bisacylphosphine oxide have a diameter of approximately 60 micrometres.

1.3 Fine-grinding

An agitator ball mill (Bachofen KDL type having a 0.6 litre grinding cylinder) is filled with 82% by volume of glass beads having a diameter of 1 mm (=500 g of glass beads based on the grinding cylinder contents) and the watercooling of the mill is commenced. At room temperature, the preground aqueous suspension according to Example 1.2 is finely ground three times in the pendulum procedure by means of the agitator ball mill at a shaft speed of 2000 rpm. The throughput is approximately 8 litres of suspension/hour. The temperature of the grinding stock increases to a maximum of 32° C. during the course of the procedure. The required degree of particle-size fineness is reached after the third grinding operation. The particle size distribution of the bisacylphosphine oxide in the suspension is ascertained using a laser granulometer. The 50% median value is approximately 2.5 micrometres; the largest particles have a diameter of approximately 12 micrometres. The result is a homogeneous formulation that flows well at room temperature, the storage stability of which at from 200 to 25° C. is more than one month (that is to say, there is no sedimentation and no serum formation).

EXAMPLE 2

Preparation of an Aqeuous Photoinitiator Formulation (D2)

[40% bis(2,4,6-trimethylbenzoyl)phenylphosphine oxide, $^{RTM}$IRGACURE 819, Ciba Spezialitätenchemie AG; 4% dispersing agent, polyvinyl alcohol with a degree of saponification of 88 mol %, $^{RTM}$MOWIOL 8-88, Hoechst AG; 0.1% bactericide, 1,2-benzoisothiazol-3-one, $^{RTM}$PROXEL BD, Novartis AG; 55.9% water (deionised)]

In a plane-ground flask filled with an anchor stirrer, 0.65 g of bactericide, ($^{RTM}$PROXEL BD) and 26.00 g of dispersing agent ($^{RTM}$MOWIOL 8-88) are introduced, with stirring, into 363.40 g of deionised water.

By heating to 65° C. and maintaining at that temperature for approximately 30 minutes, with gentle stirring, a solution is obtained. After cooling the solution to 250C while stirring slowly, 260.0 g of bis(2,4,6-trimethylbenzoyl)phenylphosphine oxide are introduced. The resulting mixture is stirred at room temperature for approximately one hour, yielding 650 g of an aqueous suspension.

The preliminary grinding and the fine grinding are carried out as described in Example 1 (1.2–1.3).

EXAMPLE 3

Preparation of an Aqueous Photoinitiator Formulation (D3)

33.0% of bis(2,4,6-trimethylbenzoyl)phenylphosphine oxide ($^{RTM}$IRGACURE 819, Ciba Spezialitätenchemie), 33.0% of modified polyacrylate as dispersing agent ($^{RTM}$EFKA 4550, efka Chemicals, Netherlands), 33.0% of deionised water, 0.3% of antifoam ($^{RTM}$BYK 023, Byk Chemie)

The components are mixed by shaking with glass beads in a disperser. For that purpose the components are introduced into a glass vessel and glass beads of 1 mm diameter (1 to 2 times the total mass of the formulation) are added thereto. The volume of the glass vessel is such that approximately 30% of the total volume is not filled (formulation volume/glass beads volume/air volume=1:1:1). This grinding batch is dispersed for 1 hour on an oscillatory shaking machine according to ISO 8780-3: 1990 (Skandex SM-5, Lau GmbH, Germany).

EXAMPLE 4

Preparation of an Aqueous Photoinitiator Formulaton (D4)

50.0% of bis(2,4,6-trimethylbenzoyl)phenylphosphine oxide ($^{RTM}$IRGACURE 819, Ciba Spezialitätenchemie), 25.0% of modified polyacrylate as dispersing agent, ($^{RTM}$EFKA 4550, efka Chemicals, Netherlands), 25.0% of deionised water, 0.3% of antifoam (*RTM*BYK 023, Byk)

The components are mixed as described in Example 3.

EXAMPLE 5

Curing of an Aqueous White Surface Coating

A white surface-coating formulation is prepared by mixing together the following components at room temperature:

55.8% of a neutralised, monomer-free and solvent-free acrylic- and urethane-modified polyether (*RTM*VIAKTIN VTE 6155w/50WA, Vianova Resins AG)

3.3% of an alkyd resin in the form of a paste with butyl glycol and solvent naphtha 150/180 (*RTM*ADDITOL XL 280, Vianova Resins AG)

102% of water 27.9% of rulile titanium dioxide (*RTM*KRONOS 2310, Kronos)

0.4% of flow agent (*RTM*BYK 307, Byk Chemie)

0.4% of flow agent (*RTM*BYK 348, Byk Chemie)

2.0% of photoinitiator (based on the binder formulation with water content)

The 2% photoinitiator is composed of 1.6% 1-benzoyi-1-hydroxy-1-methyl-ethane (*RTM*DAROCUR 1173, Ciba Spezialitätenchemie) and 0.4% bis(2,4,6-trimethylbenzoyl)-phenylphosphine oxide, (*RTM*IRGACURE 819, Ciba Spezialitätenchemie) as component of the aqueous formulations mentioned in Examples 2 and 3.

Layers are applied using a 100 lam slotted knife to chipboard panels that have been coated with a light-coloured primer, and the layers are dried for 10 minutes at 40° C. and cured using two 80 W/cm medium-pressure mercury lamps at a belt speed of 10 m/min in a UV exposure apparatus from AETEK. The pendulum hardness according to König (DIN 53157), the yellowness index (ASTMD 1925-88) and the gloss (ASTMD 532) of the cured and wipe-resistant layers are determined. The yellowness index value of the uncoated chipboard panel is 5.0. The results are represented in the following Table 1.

TABLE 1

| 2% photoinitiator | pendulum hardness [sec] | yellow-ness index | gloss (20°/60°) |
|---|---|---|---|
| 1-benzoyl-1-hydroxy-1-methyl-ethane + initiator D2 | 97 | 6.0 | 50/85 |
| 1-benzoyl-1-hydroxy-1-methyl-ethane + initiator D3 | 83 | 5.6 | 55/87 |

EXAMPLE 6

Photopolymerisation in Aqueous Solution

1% bis(2,4,6-trimethylbenzoyl)phenylphosphine oxide (as component of the aqueous formulations mentioned in Examples 1 to 4) is used to photopolymerise a 50% aqueous acrylamide solution or the ammonium salt of acrylic acid (acrylic acid neutralised with 25% ammonium hydroxide solution).

A 20 g specimen is irradiated, with gentle rotation, under TL 40/03 fluorescent tubes (Philips). The irradiation time is registered after the reaction mass has gelled. The results are illustrated in the following Table 2.

TABLE 2

| | gel times [min] | |
|---|---|---|
| photoinitiator | 50% acrylamide solution | acrylic acid/aqueous ammonium hydroxide |
| D1 | 1.5 | 8 |
| D2 | 1.5 | 25 |
| D3 | 1.0 | 3 |
| D4 | 1.0 | 5 |

EXAMPLE 7

Curing of a Coating with Outside Light

1% of the aqueous photoinitiator formulation according to Example 1 (D1) is admixed, with stirring at room temperature, with each of the following aqueous UV binder dispersions A–F:

A: water-containing urethane oligomer (*RTM*NEORAD R-440, ICI Resinels)

B: aqueous aliphatic urethane dispersion (*RTM*LUX 241 VP, Alberdingk Boley)

C: aqueous UV-crosslinkable plastics dispersion (*RTM*LUX 242 VP, Alberdingk Boley)

D: aqueous UV-crosslinkable plastics dispersion (*RTM*LUX 382 VP, Alberdingk Boley)

E: aqueous UV-crosslinkable plastics dispersion (*RTM*LUX 390 VP, Alberdingk Boley)

F: solvent-free, radiation-crosslinking dispersion based on an aliphatic polyurethane (*RTM*JÄGALUX UV 8035 W, E. Jäger Fabrik Chemischer Rohstoffe)

Layers are applied using a 100 μm slotted knife to chipboard panels that have been coated with a lightoloured primer and the layers are dried at room temperature overnight. The chipboard panels are stored in an inclined position in outside light for a few hours (Basle, May) The pendulum hardness values according to König (DIN 53157) are measured before (0) and after 30 minutes and after 3 hours of curing with outside light. In all cases a significant increase in hardness can already be detected after 30 minutes. The results are shown in the following Table 3.

TABLE 3

| | pendulum hardness [sec] after | | |
|---|---|---|---|
| formulation | 0 min | 30 min | 3 h |
| A | 13 | 84 | 78 |
| B | 32 | 67 | 68 |
| C | 24 | 62 | 73 |
| D | 15 | 36 | 56 |
| E | 18 | 52 | 54 |
| F | 14 | 39 | 42 |

EXAMPLE 8

Curing of a Wood Coating, with the Addition of Light Stabilisers, Using Outside Light 1% of the photoinitiator formulation mentioned in Example 1 (D1) and 1% of the UV absorber UV-1[*1] (*RTM*TINUVIN 1130, Ciba Spezialitätenchemie) are added to the aqueous binder dispersion A. The coatings are applied to a spruce-wood board using a paintbrush.

*¹The UV absorber UV-1 is a mixture of

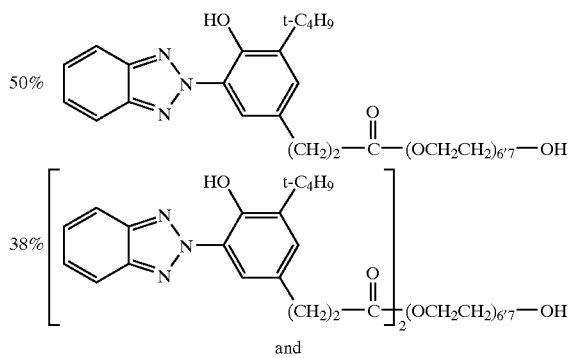

and

In a further test, before the application of formulation A the board is pretreated with a 1% aqueous solution of a sterically hindered amine-N-oxide.

After storage for 6 days in outside light (as described in Example 7), the yellowness index is measured.

An uncoated board (unexposed and exposed to light) and a coating comprising the aqueous binder dispersion A (with and without the photoinitiator formulations mentioned in Example 1) serve as references.

The results obtained are given in the following Table 4. 12% polyethylene glycol 300.

TABLE 4

| Specimen | YI |
| --- | --- |
| uncoated and unexposed | 43.7 |
| uncoated and exposed | 64.1 |
| coated with A | 64.7 |
| coated with A + 1% initiator from Example 1 (D1) | 63.0 |
| coated with A + 1% initiator from Example 1 (D1) + 1% UV absorber | 52.2 |
| pretreated with 1% aqueous amine-N-oxide solution* coated with A + 1% initiator from Example 1 (D1) + 1% UV absorber | 43.9 |

*amine-N-oxide used:

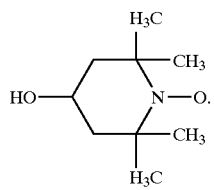

EXAMPLE 9

Curing of an Aqueous Hybrid System with Outside Light

This Example is concerned with mixtures of a component that can be dried physically (aqueous emulsion of an anionic acrylic copolymer, $^{RTM}$GLASCOL C36, Ciba Spezialitäten chemie AG) and a photocurable component (aqueous binder dispersion A).

The test formulations are listed in the following Table 5. In each case 1% of the aqueous photoinitiator formulation according to Example 1 (D1) is admixed with the formulations comprising photoinitiator. Formulations of the pure binders with and without photoinitiator are used as references.

Curing with outside light is carried out as described in Example 8. After curing, the resistance to solvents is tested using a cube of felt impregnated with ethanol. The cube of felt is left lying on the surface-coating layer, under a cover, overnight and then the condition of the layer is evaluated in the following manner:

++=no attack
+=slight attack
−=appreciable attack
−−=layer totally dissolved.

The results are given in Table 5.

TABLE 5

| components of the mixture | | | |
| --- | --- | --- | --- |
| A | $^{RTM}$GLASCOL C36 | initiator | ethanol test |
| 100% | 0 | 0 | --- |
| 100% | 0 | 1% | + |
| 0 | 100% | 0 | -- |
| 0 | 100% | 1% | -- |
| 25% | 75% | 0 | - |
| 25% | 75% | 1% | + |
| 50% | 50% | 0 | - |
| 50% | 50% | 1% | + |

EXAMPLE 10

Curing of an Aqueous "Dual-cure" System

A formulation is prepared from 36.2 parts of polyacrylate ($^{RTM}$BAYHYDROL VP LS 2271, Bayer)

0.3 part of flow agent ($^{RTM}$BYK 345, Byk Chemie)

0.3 part of flow agent ($^{RTM}$BYK 333, Byk Chemie)

16.9 parts of deionised water 52.6 parts of a urethane acrylate having isocyanate groups ($^{RTM}$ROSKYDAL FWO 2545 E, Bayer)

8.9 parts of trimethylolpropane triacrylate (UCB), and 9.3 parts of 1-methoxy-2-propanol (Fluka).

2% of a photoinitiator mixture is added to the formulation. The photoinitiator mixture is composed of 87.5% 1-[4-(2-hydroxyethoxy)-phenyl]-2-hydroxy-2-methyl-1-propan-1-one ($^{RTM}$IRGACURE 2959, Ciba Spezialitätenchemie) (PI-1) and in each case 12.5% of an aqueous photoinitiator formulation according to one of Examples 1–4 (D1-D4).

In addition, 1% of the UV absorber UV-2*² ($^{RTM}$TINUVIN 400, Ciba Spezialitätenchemie) and 0.6% of the sterically hindered amine HALS-1*³ ($^{RTM}$INUVIN 292, Ciba Spezialitätenchemie) are added to some of the mixtures.

*² The active substance of the UV absorber UV-2 is a mixture of 2-[4-[(2-hydroxy-3-dodecyl-oxypropyl)oxy]-2-hydroxyphenyl]-4,6-bis(2,4-dimethylphenyl)-1,3,5-triazine and 2-14-[(2-hydroxy-3-tridecyloxypropyt)oxy]-2-hydroxyphenyl]-4,6-bis(2,4-dimethylphenyl)-1,3,5-triazine

*³ The sterically hindered amine HALS-1 is a mixture of bis(1,2,2,6,6-pentamethyl-4-piper-idinyl)sebacate (Chem. Abstr. No. 41556-26-7) and methyl(1,2,2,6,6-pentamethyl4-piperidinyl)sebacate (Chem. Abstr. No. 82919-37-7).

Layers are applied to coil-coated aluminium sheets using a 100 μm spiral knife and the layers are then dried for 5 minutes at room temperature and subsequently for 10 minutes by heating to 80° C. Exposure is then carried out at a belt speed of 5 m/min using two 120 W/cm medium-pressure mercury lamps.

A wipe-resistant layer is obtained, the pendulum hardness (PH) of which is measured 45 minutes after curing. The results are given in the following Table 6.

TABLE 6

| photoinitiator | UV-2/HALS-1 | PH [sec.] |
| --- | --- | --- |
| PI-1 + D1 | without | 39 |
| PI-1 + D2 | without | 39 |
| PI-1 + D3 | without | 36 |
| PI-1 + D4 | without | 41 |
| PI-1 + D1 | with | 38 |
| PI-1 + D2 | with | 31 |
| PI-1 + D3 | with | 36 |
| PI-1 + D4 | with | 38 |

EXAMPLE 11

Curing of an Aqueous White Surface-coating Formulation

Various photoinitiator dispersions are incorporated into an aqueous white surface-coating formulation as described in Example 5, and the formulations are applied and cured as described in Example 5. The 2% photoinitiators are composed of 1.6% 1-benzoyl-1-hydroxy-1-methyl-ethane ($^{RTM}$DAROCUR 1173, Ciba Spezialitätenchemie) and 0.4% mono- or bis-acylphosphine oxide as component of an aqueous dispersion. After curing, the pendulum hardness of the coating is measured. The photoinitiator dispersions used (prepared analogously to the method described in Example 3) are given in Table 7a, and the curing results in Table 7b.

TABLE 7a

| constituents | photoinitiator formulation# | | |
| --- | --- | --- | --- |
| | D4 | D5 | D6 |
| bis(2,6-dimethoxybenzoyl)-2,4,4-trimethylpentylphosphineoxide | 33 | 43 | — |
| 2,4,6-trimethylbenzoyl-diphenylphosphine oxide ($^{RTM}$LUCIRIN TPO, BASF AG) | — | — | 43 |
| modified polyacrylate as dispersing agent ($^{RTM}$EFKA 4550, efka Chemicals, Netherlands) | 33 | 14 | 14 |
| deionised water | 33 | 43 | 43 |
| antifoam ($^{RTM}$BYK 023, Byk Chemie) | 0.3 | 0.4 | 0.4 | figures in parts

TABLE 7b

| photoinitiator formulation | pendulum hardness [s] |
| --- | --- |
| D4 | 105 |
| D5 | 83 |
| D6 | 20 |

EXAMPLE 12

Curing of a Non-aqueous White Surface-coating Formulation

A formulation is prepared from 74.0 parts of an unsaturated polyester, comprising 36% styrene ($^{RTM}$ROSKYDAL S502, Bayer AG)

24.5 parts of titanium dioxide ($^{RTM}$RTC2, Tioxide, France)

0.5 part of flow agent ($^{RTM}$BYK 300)

1.0 part of photoinitiator

The photoinitiator is added in the form of a dispersion (D7), prepared analogously to the method described in Example 3, containing 45.0 parts of bis(2,4,6-trimethylbenzoyl)phenylphosphine oxide ($^{RTM}$IRGACURE 819, Ciba Spezialitätenchemie, Switzerland)

4.5 parts of dispersing agent ($^{RTM}$OROTAN DP 731, Rohm & Haas)

0.1 part of bactericide: 1,2-benzoisothiazol-3-one ($^{RTM}$PROXEL BD, Novartis)

50.4 parts of dionized water.

The formulations are applied using a 150 μm slotted knife to chipboard panels that have been coated with a light-coloured primer. The curing is carried out under two 80 W/cm medium pressure mercury lamps at a belt speed of 3 m/min in a UV exposure apparatus from AETEK. The pendulum hardness according to König (DIN 53157), the yellowness index (ASTMD 1925-88) and the gloss (ASTMD 532) of the cured and wipe-resistant layers are determined. The results are given in the following Table 8.

TABLE 8

| photoinitiator formulation | pendulum hardness [sec] | yellowness index | gloss (20°/60°) |
| --- | --- | --- | --- |
| D7 | 95 | 3.5 | 81/94 |

What is claimed is:

1. An aqueous, storage-stable, non-sedimenting suspension wherein the particle size of the solid material in the suspension is less than 12 μm comprising (a) at least one mono- or bis-acylphosphine oxide of formula I

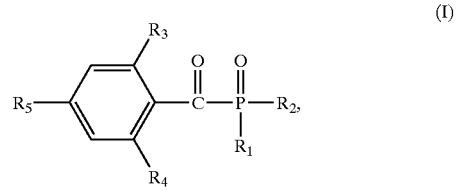

(I)

wherein $R_1$ is $C_1$–$C_{20}$alkyl; $C_2$–$C_{20}$alkyl interrupted by one or more O atoms; $C_1$–$C_{12}$alkoxy; phenyl-$C_1$–$C_4$alkyl, or phenyl that is unsubstituted or substituted by $C_1$–$C_{20}$alkyl, $C_1$–$C_{12}$alkoxy, halogen, cyclopentyl, cyclohexyl, $C_2$–$C_{12}$alkenyl, $C_2$–$C_{18}$alkyl interrupted by one or more O atoms, and/or by phenyl-$C_1$–$C_4$alkyl; or $R_1$ is biphenylyl;

$R_2$ is the radical

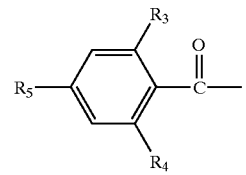

or has one of the meanings given for $R_1$;

$R_3$ and $R_4$ are each independently of the other $C_1$–$C_{12}$alkyl, $C_1$–$C_{12}$alkoxy or halogen; and $R_5$ is hydrogen, $C_1$–$C_{12}$alkyl, $C_1$–$C_{12}$alkoxy or halogen;

(b) at least one dispersant;
(c) water; and, optionally,
(d) further additives.

2. An aqueous suspension according to claim 1, comprising as component (a) a compound of formula I, wherein
$R_1$ is $C_1$–$C_{20}$alkyl; $C_1$–$C_4$alkoxy; or phenyl that is unsubstituted or substituted by $C_1$–$C_{12}$alkyl, $C_1$–$C_{12}$alkoxy and/or by halogen;
$R_2$ is the radical

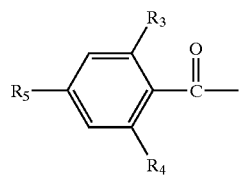

or has one of the meanings given for $R_1$;
$R_3$ and $R_4$ are each independently of the other $C_1$–$C_4$alkyl or $C_1$–$C_4$alkoxy; and
$R_5$ is hydrogen, $C_1$–$C_{12}$alkyl or $C_1$–$C_{12}$alkoxy.

3. An aqueous suspension according to claim 1, comprising as component (a)
bis(2,6-dimethoxybenzoyl)-2,4,4-trimethylpentylphosphine oxide;
bis(2,4,6-trimethylbenzoyl)-2,4-dipentyloxyphenylphosphine oxide;
bis(2,4,6-trimethylbenzoyl)phenylphosphine oxide; or
2,4,6-trimethylbenzoyldiphenylphosphine oxide.

4. An aqueous suspension according to claim 1, wherein the particle size of the solid or solids in the suspension is from 0.1 $\mu$m to 12 $\mu$m.

5. An aqueous suspension according to claim 1, comprising
from 10 to 80 parts of component (a);
from 1 to 40 parts of component (b); and
a sufficient number of parts of component (c) for the total composition to amount to 100 parts.

6. An aqueous suspension according to claim 1, comprising as component (b) polymers based on maleic acid anhydride, polyvinyl alcohol or modified polyacrylates.

7. An aqueous suspension according to claim 1, comprising
(a) a compound of formula I, wherein $R_1$ is phenyl or $C_1$–$C_{12}$alkyl; $R_2$ is

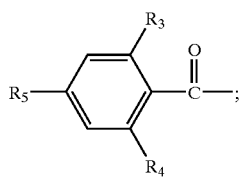

$R_3$ and
$R_4$ are $C_1$–$C_4$alkyl or $C_1$–$C_4$alkoxy; and $R_5$ is hydrogen or $C_1$–$C_4$alkyl; and
(b) as dispersant, an alkali salt of a carboxylic acid polymer, polyvinyl alcohol or a modified polyacrylate.

8. An aqueous suspension according to claim 1, comprising as additional component (d) at least one biocide.

9. An aqueous suspension according to claim 1, comprising as additional component (d) at least one UV absorber and/or a sterically hindered amine.

10. A process for the preparation of an aqueous, storage-stable, non-sedimenting photoinitiator suspension comprising
(a) at least one mono- or bis-acylphosphine oxide of formula I

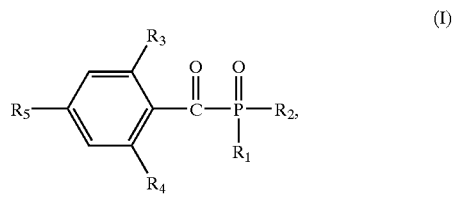

wherein $R_1$, $R_2$, $R_3$, $R_4$ and $R_5$ are as defined in claim 1,
(b) at least one dispersant,
(c) water, and, optionally,
(d) further additives by
(1) suspending components (a), (b) and (c) and, optionally, (d), by stirring;
(2) coarse-grinding the resulting mixture to a particle size of the solid material in the suspension of approximately 60 $\mu$m; and
(3) fine-grinding the mixture by one or more grinding operations to a particle size of the solid material in the suspension of less than 12 $\mu$m.

11. A photopolymerisable composition comprising
(A) at least one ethylenically unsaturated photopolymerisable compound and
(B) as photoinitiator, a suspension according to claim 1.

12. A photopolymerisable composition according to claim 11, wherein component (A) comprises at least one ethylenically unsaturated photopolymerisable compound dissolved or emulsified in water.

13. A photopolymerisable composition according to claim 11, comprising in addition to components (A) and (B) further additives (C), selected from the group consisting of UV absorbers, sterically hindered amines, biocides and/or pigments.

14. A process for the photopolymerisation of compounds having ethylenically unsaturated double bonds, which comprises irradiating a composition according to claim 11 with light in the range from 200 to 600 nm.

15. A process according to claim 14 for the production of surface coatings, printing inks, screen-printing inks, offset-printing inks, flexographic-printing inks, resist materials or image-recording material, for the production of corresponding aqueous systems.

16. A coated substrate that is coated on at least one surface with a composition according to claim 11.

* * * * *

UNITED STATES PATENT AND TRADEMARK OFFICE
CERTIFICATE OF CORRECTION

PATENT NO. : 6,803,392 B1
DATED : October 12, 2004
INVENTOR(S) : Manfred Köhler et al.

It is certified that error appears in the above-identified patent and that said Letters Patent is hereby corrected as shown below:

<u>Title page,</u>
Item [75], Inventor, should read -- Manfred Köhler, deceased, late of Freiburg (DE), by Vivian Köhler Antoin Kamran Köhler, executors, by Inga Köhler, legal representative, Berlin (DE); Beat Michael Aebil, Basel (CH); Martin Holer, Wallbach (CH); Ernst Eckstein, Rheinfelden (DE) --

Signed and Sealed this

Twenty-ninth Day of March, 2005

JON W. DUDAS
*Director of the United States Patent and Trademark Office*